US011039545B2

(12) United States Patent
Wang et al.

(10) Patent No.: US 11,039,545 B2
(45) Date of Patent: Jun. 15, 2021

(54) PULL-OUT AIDING DEVICE AND CHASSIS-WALL MODULE WITH PULL-OUT AIDING FUNCTION

(71) Applicant: FIVETECH TECHNOLOGY INC., New Taipei (TW)

(72) Inventors: Ting-Jui Wang, New Taipei (TW); Chia-Ching Liao, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 64 days.

(21) Appl. No.: 15/937,964

(22) Filed: Mar. 28, 2018

(65) Prior Publication Data

US 2018/0220544 A1    Aug. 2, 2018

Related U.S. Application Data

(63) Continuation-in-part of application No. 15/381,589, filed on Dec. 16, 2016, now abandoned.

(30) Foreign Application Priority Data

Dec. 25, 2015   (TW) ................................ 104220885

(51) Int. Cl.
  *G06F 1/18*     (2006.01)
  *H05K 7/14*     (2006.01)
  *G11B 33/12*    (2006.01)

(52) U.S. Cl.
  CPC .......... *H05K 7/1402* (2013.01); *G06F 1/187* (2013.01); *G11B 33/124* (2013.01)

(58) Field of Classification Search
  CPC ...... H05K 7/1402; G06F 1/187; G11B 33/124
  See application file for complete search history.

(56) References Cited

U.S. PATENT DOCUMENTS

| 6,288,902 | B1  |  9/2001 | Kim et al. |           |
|-----------|-----|---------|------------|-----------|
| 6,952,341 | B2* | 10/2005 | Hidaka     | G11B 33/022 |
|           |     |         |            | 312/332.1 |
| 7,511,953 | B2* |  3/2009 | Tao        | G06F 1/187 |
|           |     |         |            | 361/679.39 |
| 7,559,782 | B2  |  7/2009 | Yuh        |           |
| 8,300,398 | B2* | 10/2012 | Zhang      | G06F 1/187 |
|           |     |         |            | 312/223.2 |
| 8,705,230 | B2  |  4/2014 | Wen        |           |

(Continued)

OTHER PUBLICATIONS

Restriction Requirement dated Jul. 11, 2017 for U.S. Appl. No. 15/381,589.
Office Action dated Jan. 3, 2018 for U.S. Appl. No. 15/381,589.

*Primary Examiner* — Matthew W Ing
(74) *Attorney, Agent, or Firm* — Schmeiser, Olsen & Watts, LLP

(57) ABSTRACT

A pull-out aiding device is configured for mounting on an object, in which a corresponding apparatus is mounted. The pull-out aiding device includes a pulling member and a handle member. The pulling member includes a first pivot section and an abutting section for abutting against the corresponding apparatus to move the latter forward. The handle member includes a second pivot section and an operating section. The second pivot section is pivotally connected to the first pivot section, such that the handle member is turnable about the second pivot section relative to the pulling member and brings the latter to move forward.

7 Claims, 28 Drawing Sheets

(56) References Cited

U.S. PATENT DOCUMENTS

| | | |
|---|---|---|
| 9,042,094 B2 | 5/2015 | Williams et al. |
| 9,992,904 B2 | 6/2018 | Chen et al. |
| 2002/0050552 A1 | 5/2002 | Resnikov et al. |
| 2007/0010219 A1* | 1/2007 | Qin ...................... H04B 1/3883 455/128 |
| 2009/0279248 A1* | 11/2009 | Baker ..................... G06F 1/187 361/679.58 |
| 2011/0101831 A1* | 5/2011 | Wang ...................... G06F 1/187 312/223.1 |
| 2012/0145575 A1 | 6/2012 | Wen |
| 2013/0229766 A1 | 9/2013 | Williams |
| 2014/0022740 A1 | 1/2014 | Tsai et al. |
| 2014/0345105 A1* | 11/2014 | Brockett ................. G06F 1/187 29/428 |
| 2015/0009619 A1* | 1/2015 | Yin ......................... G06F 1/187 361/679.39 |
| 2015/0043153 A1 | 2/2015 | Zhang et al. |
| 2017/0094822 A1* | 3/2017 | Chen .................... G11B 33/128 |
| 2018/0210518 A1* | 7/2018 | Lu ........................ G11B 33/124 |

\* cited by examiner

PULL-OUT AIDING DEVICE AND CHASSIS-WALL MODULE WITH PULL-OUT AIDING FUNCTION

CROSS-REFERENCE TO RELATED APPLICATION

This application is a continuation-in-part patent application of U.S. application Ser. No. 15/381,589 filed on Dec. 16, 2016, which claims priority to Taiwanese 104220885 filed in Taiwan, R.O.C. on Dec. 25, 2015, the entire contents all of which are hereby incorporated by reference.

FIELD OF THE INVENTION

The present invention relates to a pull-out aiding device and a chassis-wall module with pull-out aiding function. The pull-out aiding device can be assembled to a chassis, a cabinet, an enclosure and the like to help a user conveniently pull out a corresponding apparatus, such as a hard disk, from the chassis, the cabinet or the enclosure.

BACKGROUND OF THE INVENTION

A conventional chassis is usually provided with an unloading mechanism, which is also referred to as a card ejection mechanism. The function of the unloading mechanism is to separate a hard disk or a circuit board from a connection port arranged in the chassis. When a user turns the unloading mechanism, the hard disk or the circuit board is pushed forward and accordingly becomes separated from the connection port. However, the unloading mechanism of the conventional chassis can only move the hard disk or the circuit board by a relatively small distance, which is usually in the range of 3 mm to 5 mm. Being hindered by partitioning walls of the chassis or other apparatus parallelly arranged at two sides of the chassis, the user often could not easily or conveniently remove the ejected card from the chassis.

SUMMARY OF THE INVENTION

A primary object of the present invention is to overcome the disadvantage of the conventional chassis by providing a pull-out aiding device that can be easily, effortlessly and conveniently operated to pull out an apparatus from the chassis.

To achieve the above and other objects, the pull-out aiding device provided according to an embodiment of the present invention is configured for mounting on an object. The pull-out aiding device includes a pulling member and a handle member. The pulling member is movably coupled with a first partitioning wall and includes a first pivot section and an abutting section. The handle member includes a second pivot section and an operating section. The second pivot section is pivotally connected to the first pivot section, such that the handle member is turnable about the second pivot section.

The handle member of the pull-out aiding device also includes a pressing section, which has a closing edge and a pulling-out edge. A vertical distance between the pulling-out edge and the second pivot section can be larger than, equal to or smaller than a vertical distance between the closing edge and the second pivot section.

The handle member of the pull-out aiding device is turnable about the second pivot section between a closed position and a pulled-out position. The closing edge is in contact with or located adjacent to the first partitioning wall when the handle member is in the closed position, and the pulling-out edge is in contact with or located adjacent to the first partitioning wall when the handle member is in the pulled-out position. And, the abutting section of the pulling member is moved forward relative to the first partitioning wall by a pulling distance when the handle member is in the pulled-out position.

The pulling member of the pull-out aiding device can include a bent section, and the bent section is located adjacent to the first pivot section and inclined toward the first partitioning wall.

According to the present invention, the first partitioning wall is provided with a guide rail unit, to which the pulling member is movably coupled.

The pull-out aiding device according to the present invention further includes a releasable fastening element, which is movably connected to the operating section of the handle member and includes one or more latch for engaging with a second partitioning wall.

According to the pull-out aiding device of the present invention, the first pivot section and the second pivot section can be pivotally turnably connected to or engaged with each other via a shaft.

The pull-out aiding device according to the present invention can further include an elastic element, which is fitted on the shaft, the pulling member or the handle member to elastically press against the pulling member or the handle member.

The pulling member of the pull-out aiding device is provided with a first limiting unit and the first partitioning wall is provided with a second limiting unit. The first and the second limiting unit interfere with each other when the handle member is in the pulled-out position.

According to an embodiment of the present invention, the first limiting unit is an elongated hole or an elongated slot and the second limiting unit is a protruded body, a hooked body or a fastening body adapted to be correspondingly received in the elongated hole or the elongated slot of the first limiting unit.

According to another embodiment of the present invention, the second limiting unit is an elongated hole or an elongated slot and the first limiting unit is a protruded body, a hooked body or a fastening body adapted to be correspondingly received in the elongated hole or the elongated slot of the second limiting unit.

According to an embodiment of the present invention, the first limiting unit includes one or more flanged bosses and the second limiting unit includes quick-release guide rails adapted to associate with the flanged bosses of the first limiting unit.

According to the above embodiment, the flanged boss has a body portion and a flange portion formed around a free end of the body portion, and the quick-release guide rail has a rail portion and a quick-release hole portion communicable with the rail portion. The body portion of the flanged boss is movably received in a corresponding rail portion; the flange portion of the flanged boss has a diameter larger than a diameter of the body portion and a width of the rail portion; and the diameter of the flange portion is smaller than a diameter of the quick-release hole portion.

According to the above embodiment, a distance between the one or more flanged bosses can be larger than, smaller than or equal to a distance between the quick-release hole portions of the one or more quick-release guide rails.

According to an embodiment of the present invention, the handle member includes a return hook, which is arranged at an end of the handle member having the second pivot section formed thereat.

To achieve the above and other objects, the pull-out aiding device provided according to another embodiment of the present invention and configured for mounting on an object includes a pulling member, a handle member and a releasable fastening element. The pulling member includes a first pivot section and an abutting section. The handle member includes a second pivot section and an operating section; and the second pivot section is pivotally connected to the first pivot section, such that the handle member is turnable about the second pivot section. The releasable fastening element is movably connected to the operating section of the handle member and includes a receiving space and a retaining section. The operating section of the handle member is movably associated with the receiving space of the releasable fastening element, and the retaining section is used to detachably engage with a first object. In another operable embodiment of the present invention, the releasable fastening element includes a body portion movably associated with a receiving space of the operating section of the handle member.

According to the other embodiment of the pull-out aiding device, the receiving space of the releasable element and the operating section of the handle member are connected to each other via pin connection means, such that the releasable fastening element and the handle member are movable relative to each other within a limited range. Alternatively, the receiving space of the handle member and the body portion of the releasable fastening element can be connected to each other via pin connection means, such that the releasable fastening element and the handle member are movable relative to each other within a limited range.

According to the other embodiment of the pull-out aiding device, the receiving space of the releasable fastening element can have an elastic element disposed therein with an end of the elastic element pressed against the receiving space and another opposite end against the operating section of the handle member, such that the releasable fastening element and the handle member are movable relative to each other within a limited range and can be elastically pushed by the elastic element back to their original positions. Alternatively, the receiving space of the handle member can have an elastic element disposed therein with an end of the elastic element pressed against the receiving space and another opposite end against the body portion of the releasable fastening element, such that the releasable fastening element and the handle member are movable relative to each other within a limited range and can be elastically pushed by the elastic element back to their original positions.

To achieve the above and other objects, the pull-out aiding device provided according to a further embodiment of the present invention and configured for mounting on an object includes a pulling member, a handle member and a releasable fastening element. The pulling member includes a first pivot section and an abutting section. The handle member includes a second pivot section and an operating section; the second pivot section is pivotally connected to the first pivot section, such that the handle member is turnable about the second pivot section; and the operating section is provided with a receiving chamber. The releasable fastening element is movably associated with the receiving chamber of the operating section and includes one or more latches. In an operable embodiment, the one or more latches of the releasable fastening element are respectively provided with a receiving chamber, and the operating section of the handle member is movably associated with the receiving chamber of the latch.

According to the further embodiment of the pull-out aiding device, the latch of the releasable fastening element can have a hand shifting member movably assembled thereto. The latch includes a movement-driven surface and the hand shifting member includes a movement-driving surface. When the hand shifting member is moved to press the movement-driving surface against the movement-driven surface of the latch, the latch is caused to displace in the receiving chamber of the operating section.

According to the further embodiment, the pull-out aiding device can further include an elastic element selectively disposed between the latch and the hand shifting member with two ends of the elastic element separately pressed against the latch and the hand shifting member; or the elastic element can be disposed between the latch and the operating section with two ends of the elastic element separately pressed against the latch and the operating section.

According to the further embodiment of the pull-out aiding device, the latch of the releasable fastening element can have a hand shifting member movably assembled thereto, the receiving chamber of the operating section can have a first elastic element disposed therein with two ends of the first elastic element separately pressed against the latch and the operating section, and the second pivot section of the handle member can have a second elastic element disposed thereon with two ends of the second elastic element separately pressed against the pulling member and the handle member.

According to the further embodiment of the pull-out aiding device, the hand shifting member or the handle member can be provided with a stop portion and a movement opening, within which the stop portion is movable.

According to the further embodiment of the pull-out aiding device, the latch can be coupled with the operating section via at least one coupling member or pin connection means; or the releasable fastening element can be connected to the operating section via at least one couple member or pin connection means.

According to the further embodiment of the pull-out aiding device, the latch of the releasable fastening element can movably interfere with a hand shifting member, and the hand shifting member can be movably assembled to the operating section via pin connection means; or the latch of the releasable fastening element can have a hand shifting member movably assembled thereto via pin connection means.

In the pull-out aiding device according to the present invention, the abutting section is used to pull a corresponding apparatus, and the abutting section is selected from the group consisting of an L-shaped member, a hook, a protrusion, a recessed member, a stepped structure, a flat member, a cambered member, a curved member, a latch, a box, a case and a coupling member.

In the pull-out aiding device according to the present invention, the abutting section is used to pull a corresponding apparatus, and the corresponding apparatus can be a hard disk drive, a memory, a printed circuit board (PCB), a case, a block or a display card.

In the pull-out aiding device according to the preferred embodiment of the present invention, the handle member is provided with a window, and things located behind the window can be seen via the window.

With the above arrangements, the pull-out aiding device and the chassis-wall module according to the present invention can be easily and effortlessly operated to help a user conveniently remove a corresponding apparatus from a chassis.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
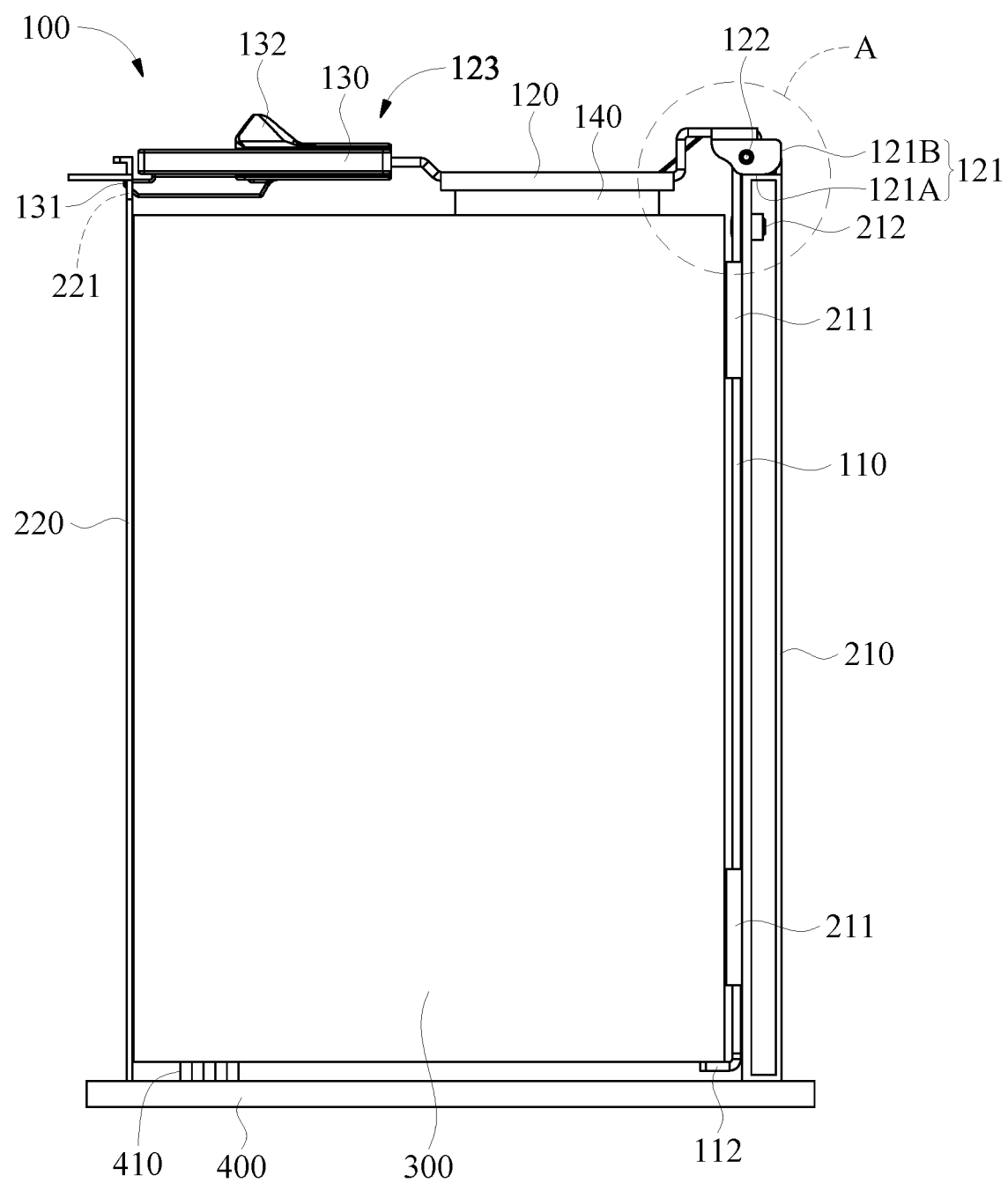
FIG. 1 is a schematic view showing a pull-out aiding device according to a first preferred embodiment of the present invention and a corresponding apparatus to be pulled out with the pull-out aiding device.

The present invention will now be described with some preferred embodiments thereof and by referring to the accompanying drawings. For the purpose of easy to understand, elements that are the same in the preferred embodiments are denoted by the same reference numerals.

Figure 2:
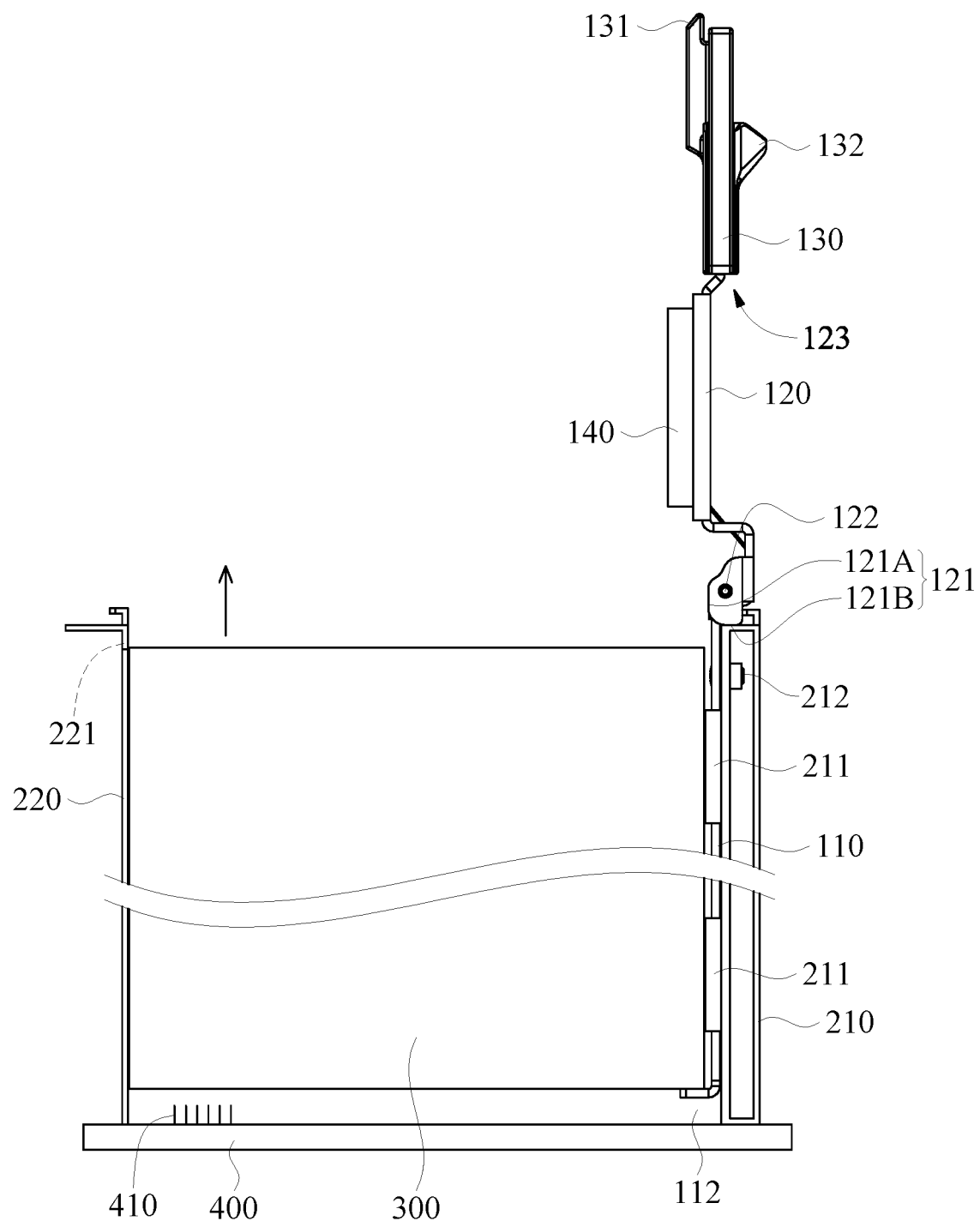
FIG. 2 is a schematic view showing a handle member of the pull-out aiding device of FIG. 1 in a pulled-out position.
Figure 3:
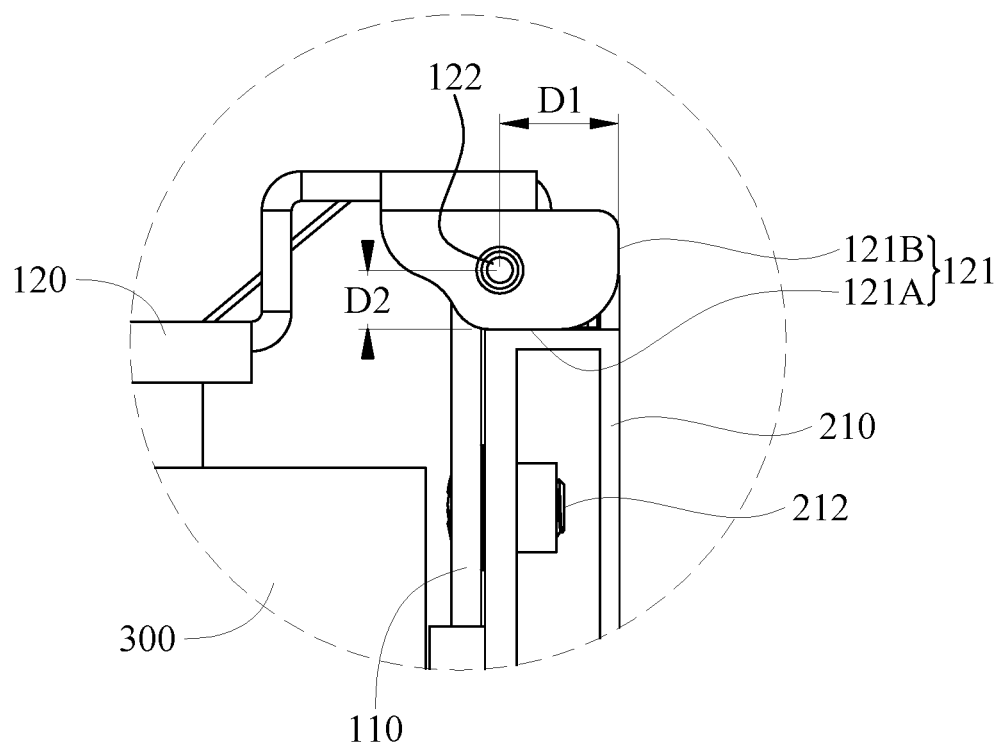
FIG. 3 is an enlarged view of the circled area A of FIG. 1.

Please refer to FIGS. 1 to 3. A pull-out aiding device 100 according to a first preferred embodiment of the present invention is configured for mounting on an object, which includes a first partitioning wall 210 or/and a second partitioning wall 220 located opposite to each other. In the object, a corresponding apparatus 300, such as a hard disk drive, a memory, a printed circuit board (PCB), a case, a block or a display card, can be mounted. The object also includes a top wall and a bottom wall (not shown), which are connected to the first and the second partitioning wall 210, 220. That is, the first partitioning wall 210, the second partitioning wall 220, the top wall and the bottom wall together define a receiving space, in which the corresponding apparatus 300 is received, and an opening communicating with the receiving space. A circuit board 400 is arranged in the receiving space and has a connection port 410 provided thereon for connecting to a corresponding connection jack (not shown) on the corresponding apparatus 300, such as a hard disk.

The object can be, for example, a chassis, a drawer, a hole, a recess, a cover or a wall panel.

The pull-out aiding device 100 includes a pulling member 110 and a handle member 120. The pulling member 110 is movably coupled with the first partitioning wall 210, and includes a first pivot section 111 (see FIG. 4) and an abutting section 112, which are located at two opposite ends of the pulling member 110. The abutting section 112 is abutted against the corresponding apparatus 300 for pushing the latter forward. The handle member 120 includes a pressing section 121, a second pivot section 122 and an operating section 123. The second pivot section 122 is located adjacent to the pressing section 121 and pivotally connected to the first pivot section 111, such that the handle member 120 is turnable about the second pivot section 122 to move between a closed position, as shown in FIG. 1, and a pulled-out position, as shown in FIG. 2. The pressing section 121 has a closing edge 121A and a pulling-out edge 121B. As shown in FIG. 3, a vertical distance D1 between the pulling-out edge 121B and the second pivot section 122 is larger than a vertical distance D2 between the closing edge 121A and the second pivot section 122. However, it is not necessary for the vertical distance D1 to be larger than the vertical distance D2. In other possible arrangements, the vertical distance D1 between the pulling-out edge 121B and the second pivot section 122 can be equal to or smaller than the vertical distance D2 between the closing edge 121A and the second pivot section 122.

When the handle member 120 is in the closed position, the closing edge 121A is in contact with or located adjacent to the first partitioning wall 210. When the handle member 120 is in the pulled-out position, the pulling-out edge 121B is in contact with or located adjacent to the first partitioning wall 210 and the abutting section 112 is moved forward relative to the first partitioning wall 210 by a pulling distance, which has relation to the vertical distance D1 between the pulling-out edge 121B and the second pivot section 122 and the vertical distance D2 between the closing edge 121A and the second pivot section 122. The pulling distance can be in the range of, for example, 0.5 mm to 500 mm.

In the first preferred embodiment, when the handle member 120 is in the closed position, it is located perpendicular or non-parallel to the first partitioning wall 210. On the other hand, when the handle member 120 is in the pulled-out position, it is located in parallel or non-perpendicular to the first partitioning wall 210.

As can be seen in FIGS. 1 and 2, the abutting section 112 is in the form of an L-shaped arm for abutting against, for example, a rear side of the corresponding apparatus 300. When the pulling member 110 is moved forward, the abutting section 112 also pushes the corresponding apparatus 300 forward. However, it is understood the abutting section 112 is not necessarily limited to the L-shaped arm but can be other differently shaped structures, such as a hook, a protrusion, a recessed member, a stepped structure, a flat member, a cambered member, a curved member, a latch, a box, a case or a coupling member.

In the first preferred embodiment, the first partitioning wall 210 is provided on one side facing the second partitioning wall 220 with a guide rail unit 211, to which the pulling member 110 is movably coupled, so that the pulling member 110 can be moved relative to the first partitioning wall 210 in a direction away from the circuit board 400 and toward the opening of the object.

When the handle member 120 is operated to turn from the closed position to the pulled-out position, since the vertical distance D1 between the pulling-out edge 121B of the pressing section 121 and the second pivot section 122 is larger than the vertical distance D2 between the closing edge 121A of the pressing section 121 and the second pivot section 122, the pulling member 110 is brought by the handle member 120 to move outward relative to the first partitioning wall 210. At this point, the abutting section 112 pushes the corresponding apparatus 300 forward to thereby separate the latter from the connection port 410 and bring a front side of the corresponding apparatus 300 to extend beyond the first and the second partitioning wall 210, 220. Then, the handle member 120 can be further outward pulled by a predetermined distance for the corresponding apparatus 300 to expose more from the opening of the object and a user can conveniently remove the corresponding apparatus 300 from the object with one hand.

Figure 4:
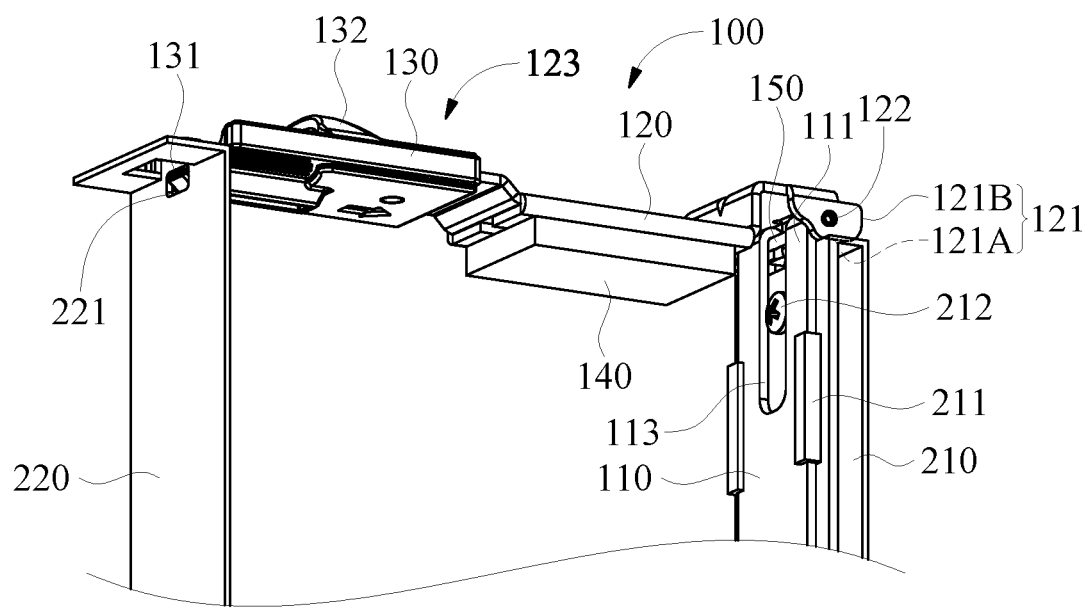
FIG. 4 is a fragmentary perspective view of the pull-out aiding device of FIG. 1.

Please refer to FIG. 4. The first pivot section 111 and the second pivot section 122 are pivotally turnably connected to each other via a shaft 150. However, it is understood the first and the second pivot section 111, 122 can be otherwise connected together via a hinge structure or be engaged with each other via an engaging structure.

The pulling member 110 is provided with a first limiting unit 113. When the handle member 120 is located at the pulled-out position, the first limiting unit 113 interferes with a second limiting unit 212 provided on the first partitioning wall 210 to limit a maximum length by which the pulling member 110 can be pulled out beyond the first partitioning wall 210. In the first preferred embodiment, the first limiting unit 113 is an elongated hole, and the second limiting unit 212 is a protruded body adapted to be correspondingly received in the above-mentioned elongated hole. In practical implementation of the present invention, the protruded body can be a screw, a nut or a rivet locked to the first partitioning wall 210. It is understood the first limiting unit 113 and the second limiting unit 212 are not necessarily limited to the above-described structure. For example, the first limiting unit 113 can be otherwise an elongated slot, while the second limiting unit 212 can be a hooked body adapted to be correspondingly received in the elongated slot. Alternatively, the second limiting unit 212 can be an elongated hole or an elongated slot, while the first limiting unit 113 can be a protruded body or a hook adapted to be correspondingly received in the elongated hole or the elongated slot.

The pull-out aiding device 100 can further include a shock-absorbing member 140, which is disposed on one side of the handle member 120 facing toward the corresponding apparatus 300 to avoid impact of the handle member 120 on the corresponding apparatus 300. The shock-absorbing member 140 can be, for example, a piece of foam rubber, sponge or other similar soft material or elastomer.

Figure 5:
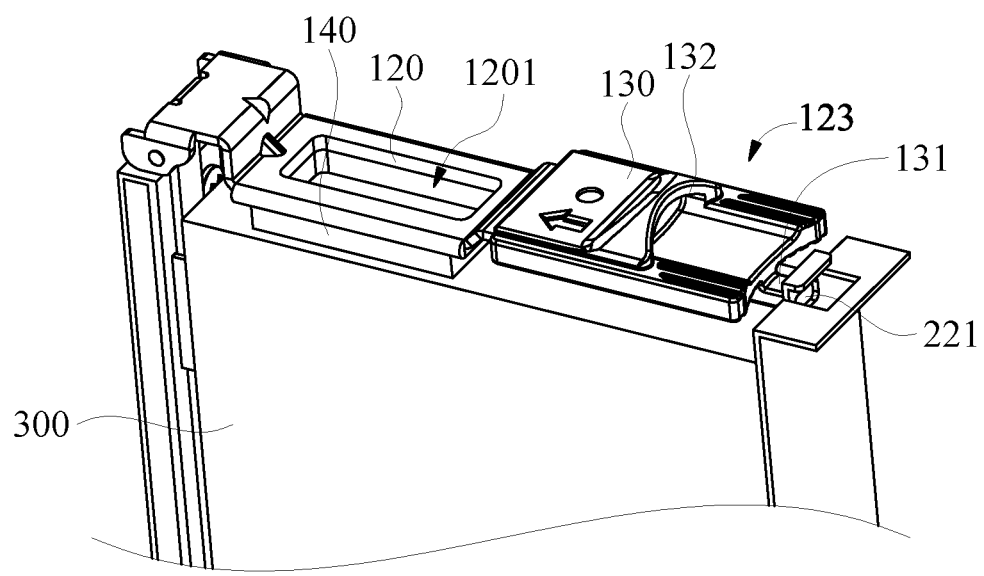
FIG. 5 is another fragmentary perspective view of the pull-out aiding device of FIG. 1.

As can be seen in FIGS. 4 and 5, the pull-out aiding device 100 can further include a releasable fastening element 130, which is movably connected to the operating section 123 of the handle member 120. The releasable fastening element 130 includes a latch 131 for engaging with a latch hole 221 provided on the second partitioning wall 220 to hold the handle member 120 to the closed position. Also, the releasable fastening element 130 can include a hand shifting member 132 that is raised from an outer surface of the releasable fastening element 130.

In the illustrated first preferred embodiment, the pulling member 110 or the handle member 120 can be made of a metal material or a plastic material. The handle member 120 is provided with a window 1201, via which an operator can see things located behind the window 1201. When the corresponding apparatus 300, such as the hard disk drive, the memory, the printed circuit board (PCB), the case, the block or the display card, has been mounted, the window 1201 is aligned with a barcode (not shown) of the corresponding apparatus 300, so that the barcode behind the window 1201 can be directly scanned through the window 1201 by the operator without the need of opening the pull-out aiding device 100. Therefore, the pull-out aiding device 100 is convenient for use. Further, when the handle member 120 has the shock-absorbing member 140 disposed at a lower side thereof, the shock-absorbing member 140 is also provided with an opening corresponding to the window 1201 to facilitate the barcode scanning.

Figure 6:
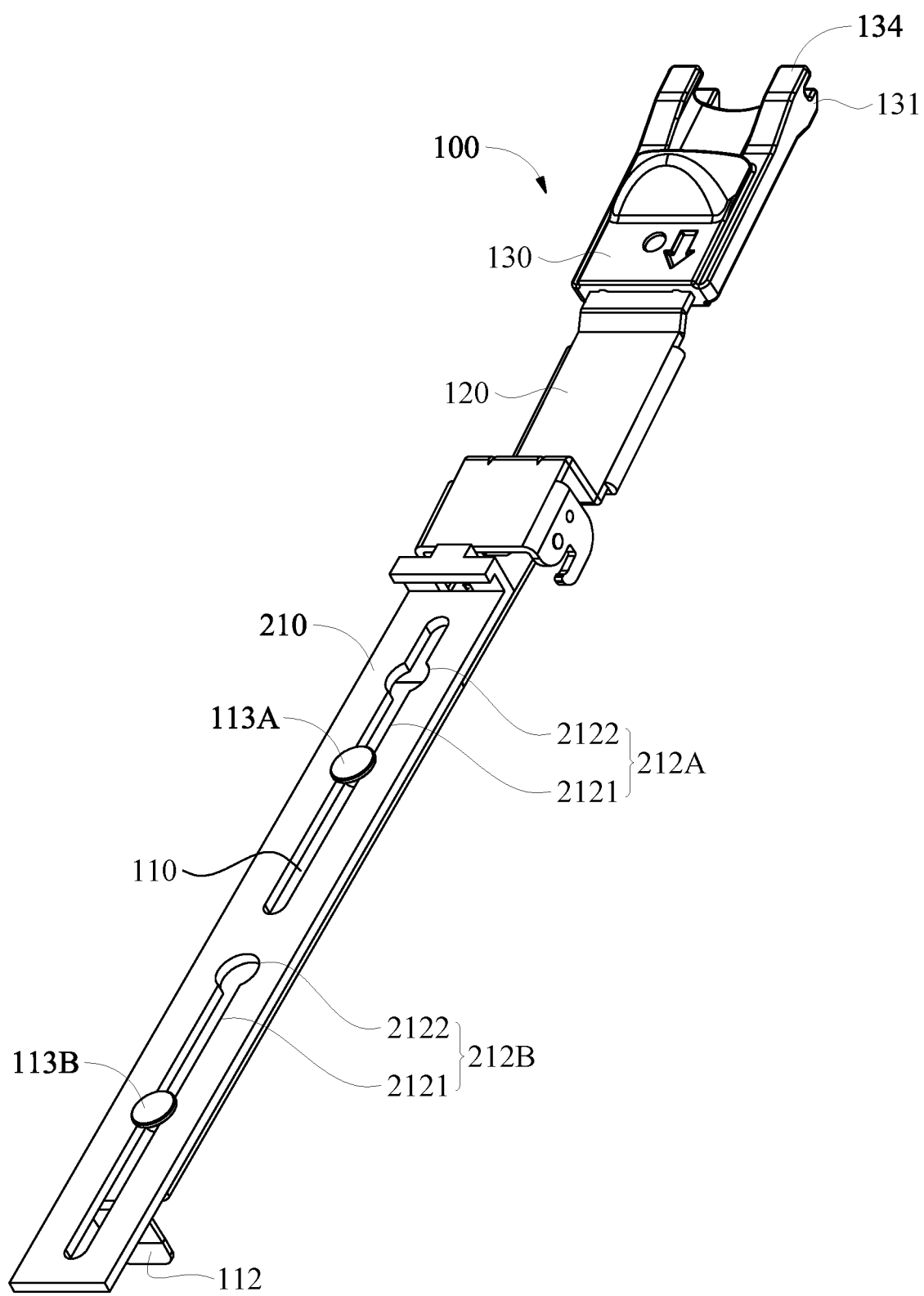
FIG. 6 is an assembled perspective view showing first and second limiting units for a first variation of the pull-out aiding device according to the first preferred embodiment of the present invention.
Figure 7:
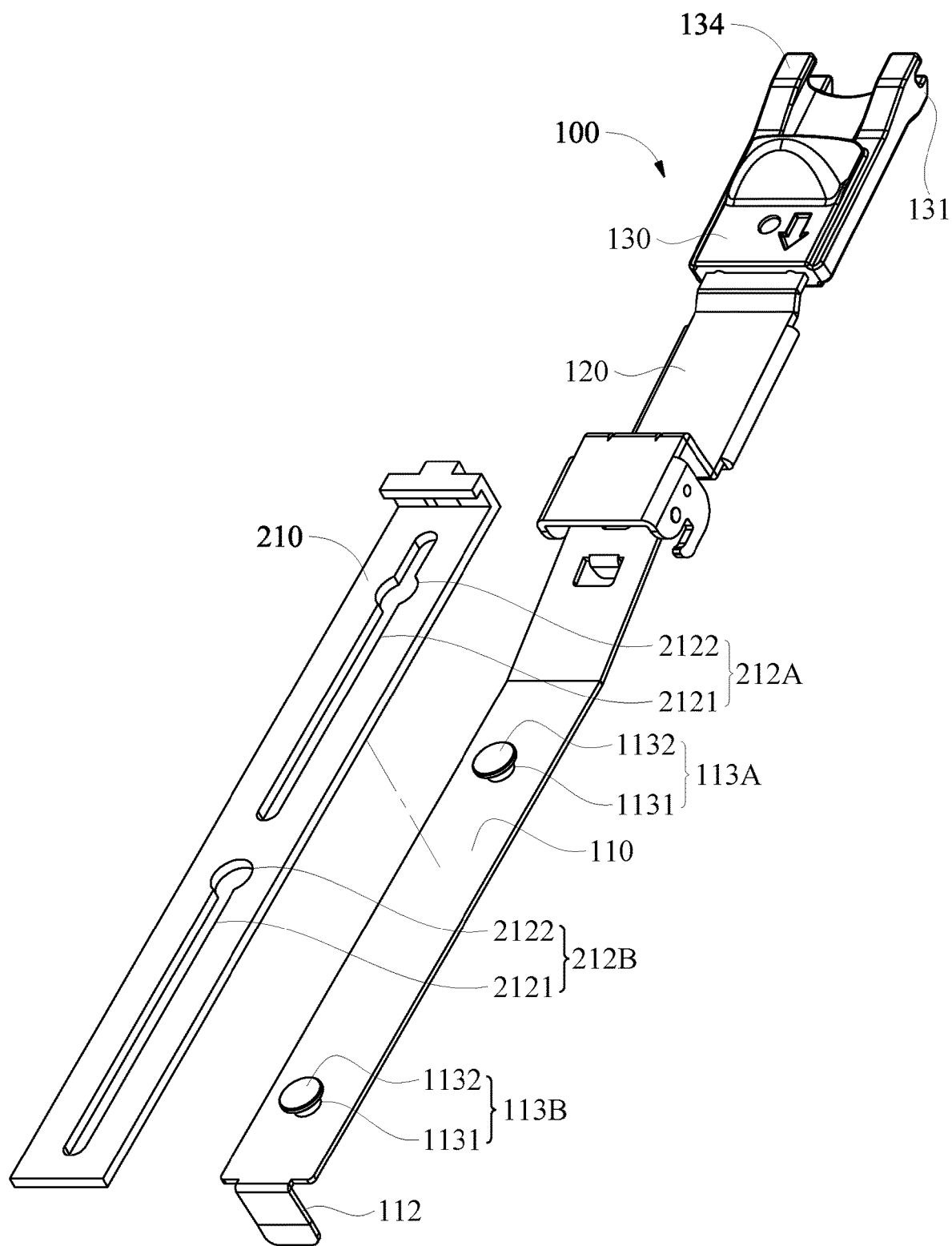
FIG. 7 is an exploded view of FIG. 6.

Please refer to FIGS. 6 and 7, in which the first and second limiting units for a first variation of the pull-out aiding device 100 are shown. According to the first variation, the first limiting unit 113 includes two flanged bosses 113A, 113B, and the second limiting unit 212 includes two quick-release guide rails 212A, 212B that are associated with the two flanged bosses 113A, 113B in a one-to-one correspondence. As can be seen in FIGS. 6 and 7, the two flanged bosses 113A, 113B are movable in along the corresponding quick-release guide rails 212A, 212B.

In addition, the releasable fastening element 130 can have more than one latch 131. In the illustrated first variation of the first preferred embodiment, there are shown two latches 131. Correspondingly, the second partitioning wall 220 can be provided with more than one latch hole 221 (not shown in FIGS. 6 and 7) for the latches 131 to engage with. The releasable fastening element 130 further has two locating stoppers 134, which are adapted to abut against a front edge of the second partitioning wall 220, so that the releasable fastening element 130 and the second partitioning wall 220 are held in place relative to each other.

Figure 8:
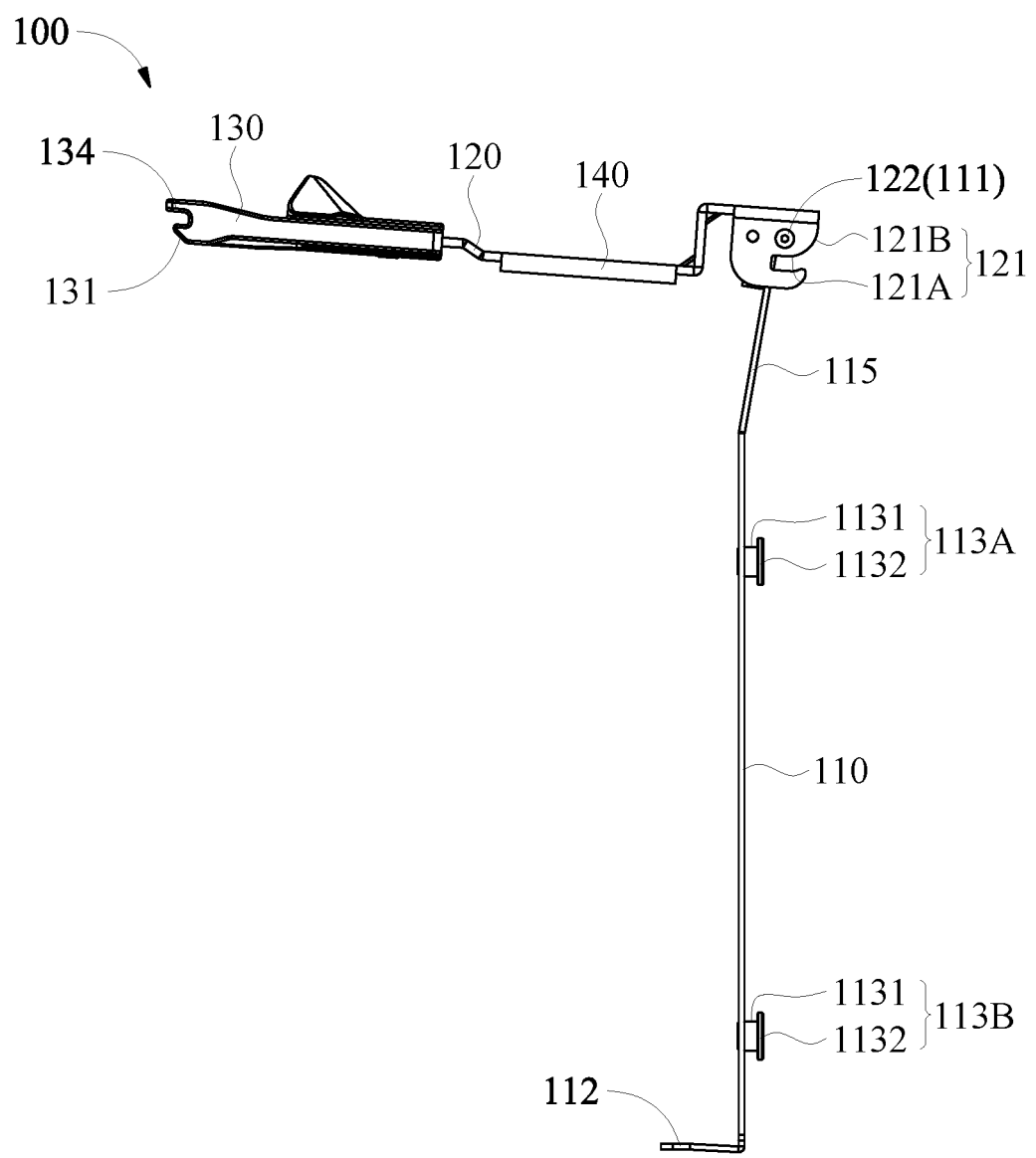
FIG. 8 is a side view showing the first limiting unit for the first variation of the pull-out aiding device according to the first preferred embodiment of the present invention.

Please refer to FIGS. 6, 7 and 8. In the first variation of the first preferred embodiment, the flanged bosses 113A, 113B respectively have a body portion 1131 and a flange portion 1132 formed around a free end of the body portion 1131. The quick-release guide rails 212A, 212B respectively have a rail portion 2121 and a quick-release hole portion 2122 communicable with the rail portion 2121. The body portions 1131 of the flanged bosses 113A, 113B are separately movably received in the corresponding rail portions 2121. The flange portions 1132 of the flanged bosses 113A, 113B have a diameter larger than a diameter of the body portions 1131 and a width of the rail portions 2121, so that the flanged bosses 113A, 113B are limited to move only within the corresponding rail portions 2121. Also, the diameter of the flange portions 1132 is smaller than a diameter of the quick-release hole portions 2122. When the flanged bosses 113A, 113B are moved in the rail portions 2121 to positions corresponding to the quick-release hole portions 2122, the flange portions 1132 can be moved out of the quick-release hole portions 2122, allowing the pull-out aiding device 100 to be detached from the first partitioning wall 210.

Figure 9:
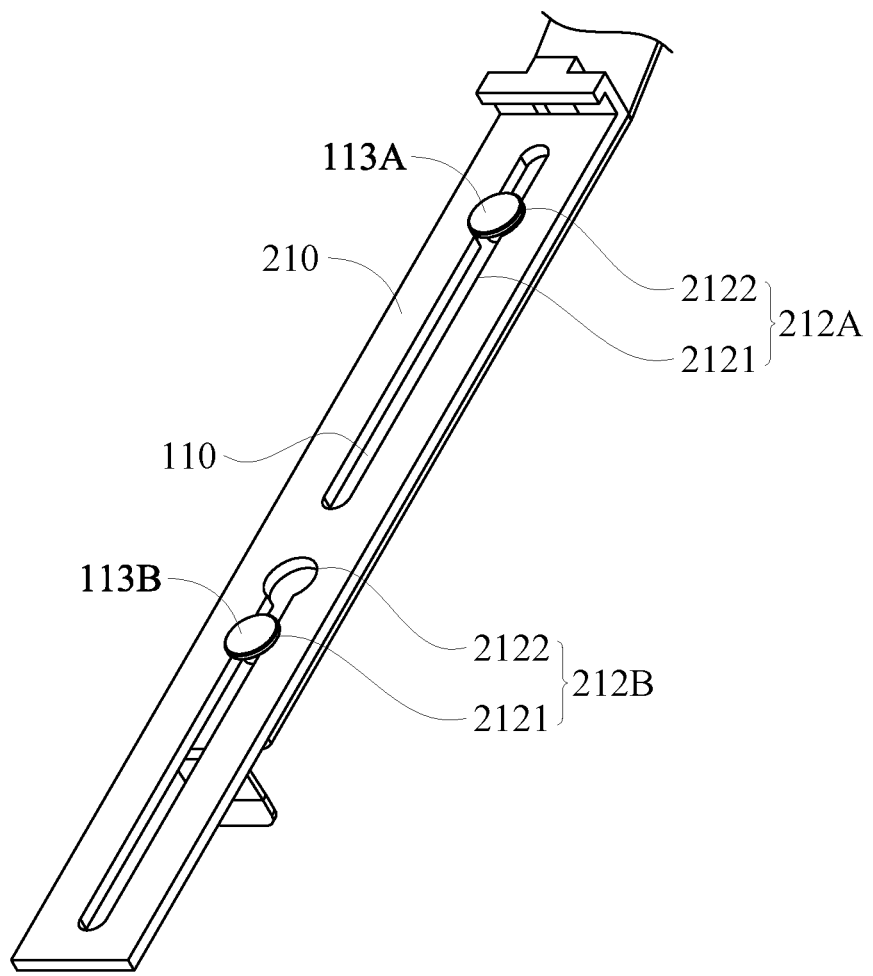
FIG. 9 shows how the first and second limiting units of FIG. 6 work to limit the movement of the pull-out aiding device.
Figure 10:
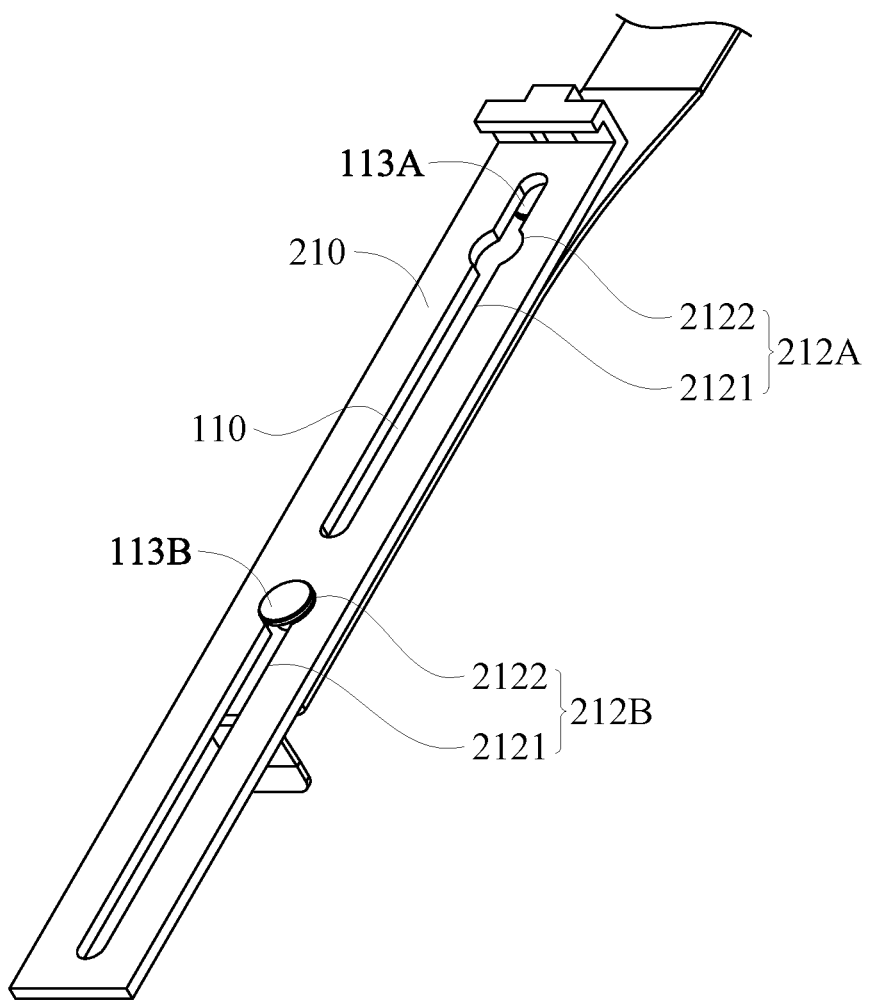
FIG. 10 is another view showing how the first and second limiting units of FIG. 6 work to limit the movement of the pull-out aiding device.

Further, a distance between the two flanged bosses 113A, 113B can be larger than, smaller than or equal to a distance between the two quick-release hole portions 2122 of the two quick-release guide rails 212A, 212B. Therefore, as shown in FIGS. 9 and 10, the two flanged bosses 113, 113B would not simultaneously disengage from the two quick-release guide rails 212A, 212B. Preferably, on the quick-release guide rail 212B, the quick-release hole portion 2122 is arranged at a front end of the rail portion 2121, i.e. a point on the quick-release guide rail 212B that is closest to the second pivot section 122; and on the quick-release guide rail 212A, the quick-release hole portion 2122 is arranged at a point on the rail portion 2121 that is located behind the front end of the rail portion 2121 by a predetermined distance. Accordingly, when the pulling member 110 is pulled outward relative to the first partitioning wall 210, the flanged boss 113A will reach at the quick-release hole portion 2122 of the quick-release guide rail 212A first, allowing the flange portion 1132 of the flanged boss 113A to move out of the quick-release hole portion 2122 of the quick-release guide rail 212A. Thereafter, when the pulling member 110 is further pulled outward for the flanged boss 113B to reach at the quick-release hole portion 2122 of the quick-release guide rail 212B, the flange portion 1132 of the flanged boss 113B can be easily disengaged from the quick-release hole portion 2122 of the quick-release guide rail 212B, allowing the pull-out aiding device 100 to be fully detached from the first partitioning wall 210.

Figure 11:
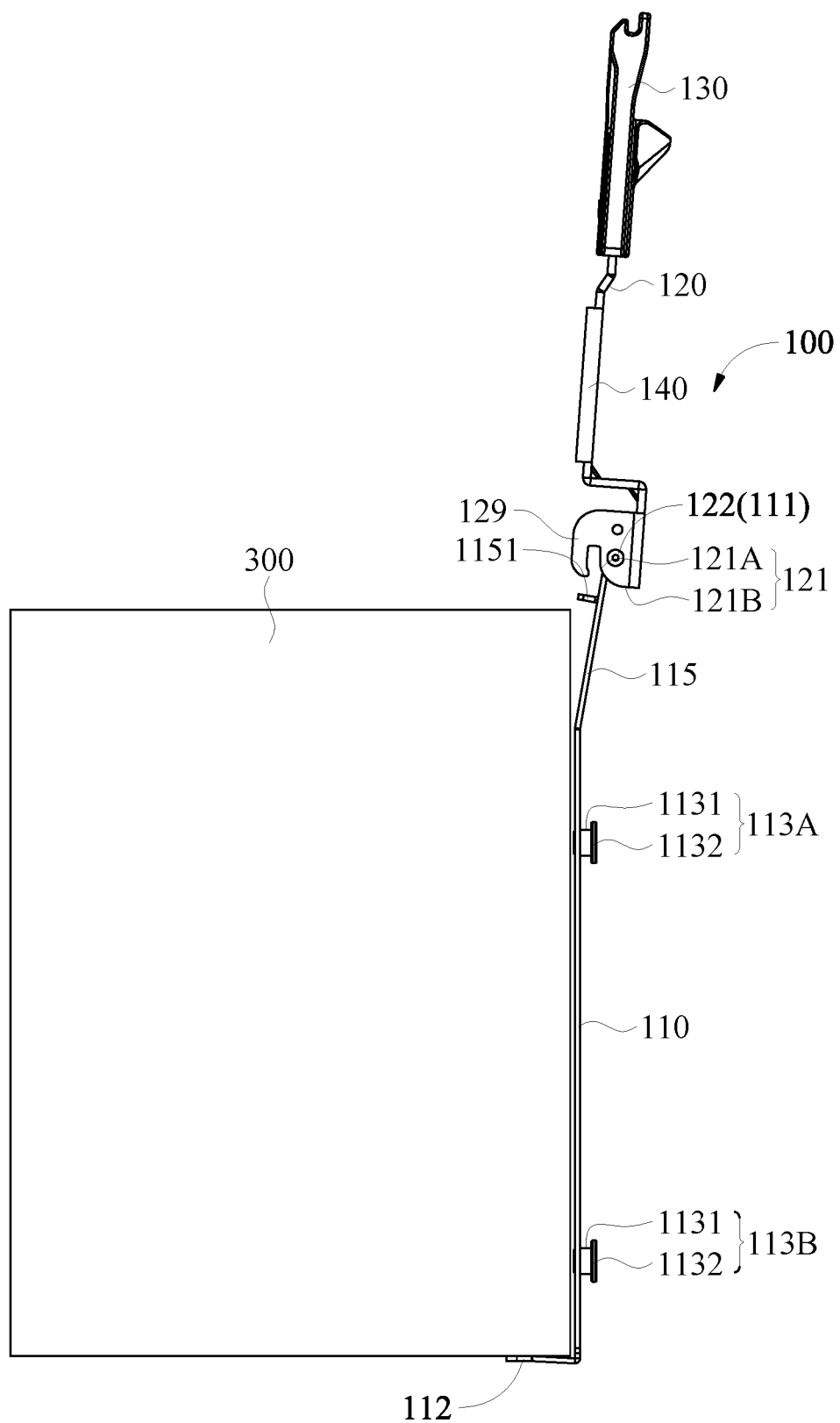
FIG. 11 is a schematic view showing a pulling member of the pull-out aiding device according to the first preferred embodiment of the present invention includes a bent section.

As can be seen in FIG. 11, the pulling member 110 can have a springy bent section 115, which is located adjacent to the first pivot section 111 and inclined toward the first partitioning wall 210 by an inclining angle from 1 to 90 degrees. The bent section 115 is provided with a male foolproof retainer 1151 for ensuring correct mounting of the corresponding apparatus 300 in the object. That is, when the corresponding apparatus 300 is correctly mounted, the abutting section 112 and the foolproof retainer 1151 are pressed against two opposite end surfaces of the corresponding apparatus 300. On the other hand, in the case the corresponding apparatus 300 is not correctly mounted in the object, the foolproof retainer 1151 interferes with the corresponding apparatus 300 and the pull-out aiding device 100 could not be pushed into the object. And, when the pulling member 110 has not yet been pulled outward, the bent section 115 is pushed by the first partitioning wall 210 against the corresponding apparatus 300 and is accordingly located in parallel to the first partitioning wall 210 or located at a position with a reduced inclining angle relative to the first partitioning wall 210. On the other hand, when the pulling member 110 is outward pulled relative to the first partitioning wall 210 and the bent section 115 is exposed from the object, the bent section 115 automatically inclines outward relative to the corresponding apparatus 300 and the foolproof retainer 1151 or the handle member 120 does not hinder the removal of the corresponding apparatus 300 from the object, allowing the corresponding apparatus 300 to be pulled out smoothly.

According to the present invention, the whole handle member 120 can be made of a plastic material and can have a window formed thereon. Via the window, the corresponding apparatus 300 can be seen from outside of the pull-out aiding device 100.

As shown in FIG. 6, the releasable fastening element 130 can be configured to have two latches 131 and two locating stoppers 134. The locating stoppers 134 are adapted to abut against a front edge of the second partitioning wall 220 and thereby hold the releasable fastening element 130 and the second partitioning wall 220 in place relative to each other. In the illustrated first variation of the first preferred embodiment, the releasable fastening element 130 is connected to the operating section 123 via a plurality of compression springs.

Please refer back to FIG. 4. The shaft 150 mounted between the first pivot section 111 of the pulling member 110 and the second pivot section 122 of the handle member 120 has an elastic element fitted thereon. The elastic element elastically presses against the pulling member 110 and the handle member 120, such that the handle member 120, once being opened, can be automatically turned by the elastic element to restore to its original position. The elastic element can be a helical spring, a torsion spring, an elastic cylinder or a sheet spring.

As can be seen in FIG. 11, the handle member 120 can further include a return hook 129, which can be arranged at an end of the handle member 120 having the second pivot section 122 formed thereat. Meanwhile, the first partitioning wall 210 is correspondingly provided with a return hook hole (not shown), to which the return hook 129 is hooked when the handle member 120 is closed.

Figure 12:
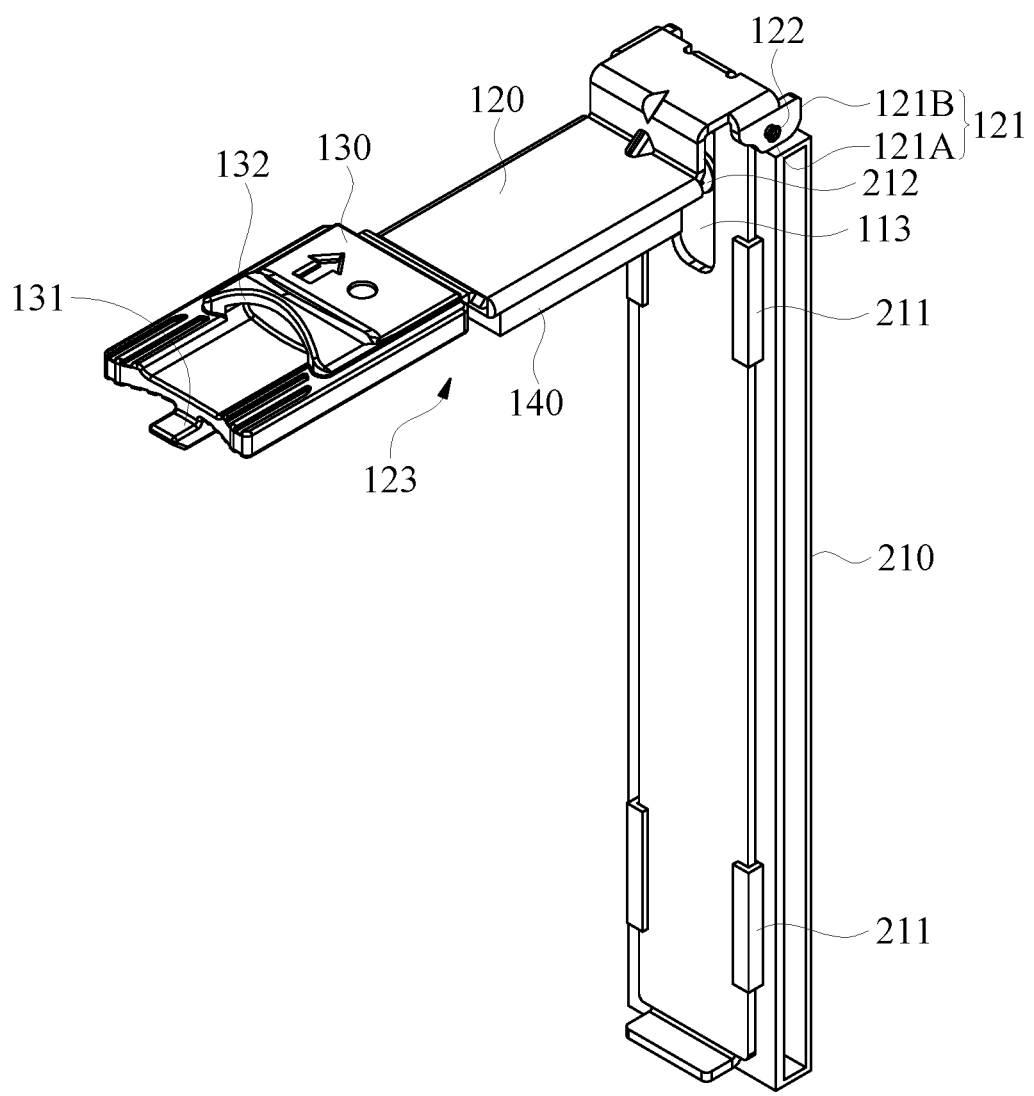
FIG. 12 is a perspective view showing a chassis-wall module according to a second preferred embodiment of the present invention.
Figure 13:
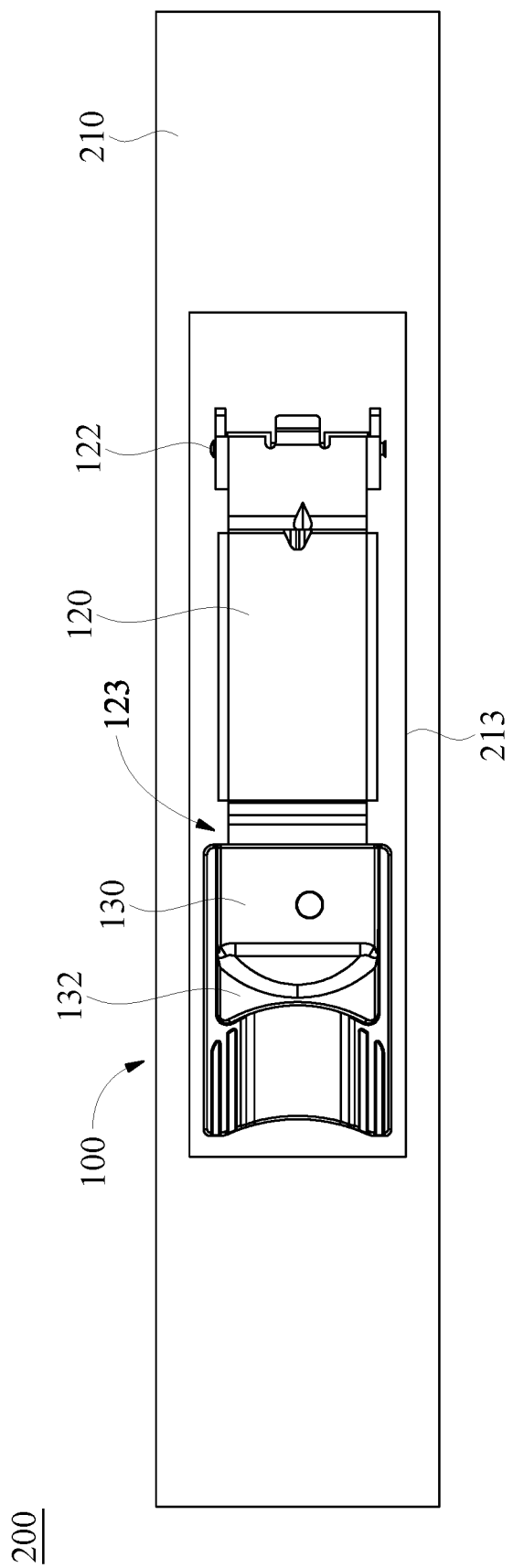
FIG. 13 is a plan view showing a variation of the chassis-wall module according to the second preferred embodiment of the present invention.

Please refer to FIG. 12, in which a chassis-wall module 200 with pull-out aiding function according to a second preferred embodiment of the present invention is shown, and to FIG. 13, in which a variation of the second preferred embodiment is shown.

As can be seen in FIG. 12, the chassis-wall module 200 includes a first partitioning wall 210 and a pull-out aiding device 100 described in the first preferred embodiment of the present invention; and the pulling member 110 of the pull-out aiding device 100 is movably coupled with the first partitioning wall 210.

As shown in FIG. 13, a variation of the chassis-wall module 200 includes a first partitioning wall 210 and a pull-out aiding device 100 described in the second embodiment of the present invention; and the pulling member 110 of the pull-out aiding device 100 is movably coupled with the first partitioning wall 210. In this case, the first partitioning wall 210 includes a receiving recess 213, and the pulling member 110 is arranged in the receiving recess 213.

In summary, the pull-out aiding device 100 and the chassis-wall module 200 according to the present invention can be easily and effortlessly operated to help a user conveniently remove a corresponding apparatus from a chassis.

Figure 23:
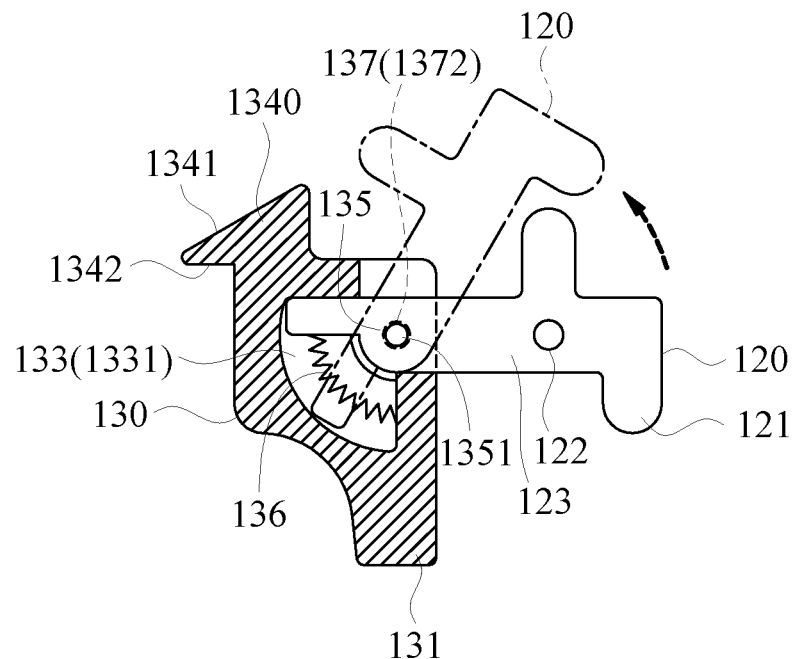
FIG. 23 is a partially sectioned front view of a pull-out aiding device according to a fourth embodiment of the present invention.
Figure 24:
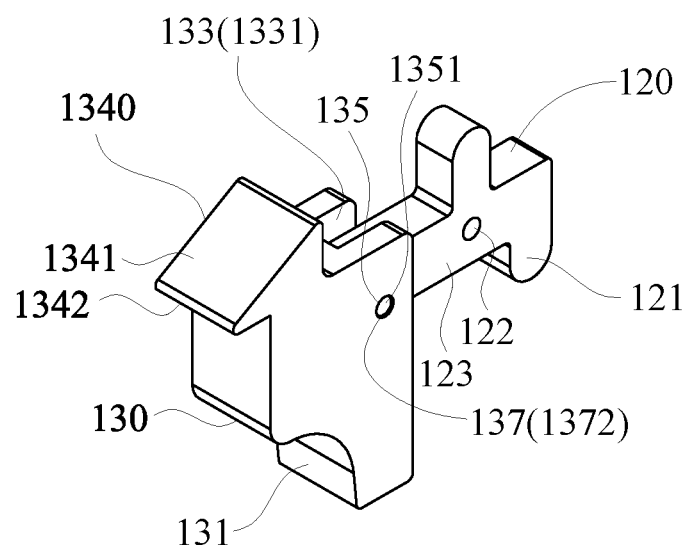
FIG. 24 is a perspective view of the pull-out aiding device according to the fourth embodiment of the present invention.
Figure 25:
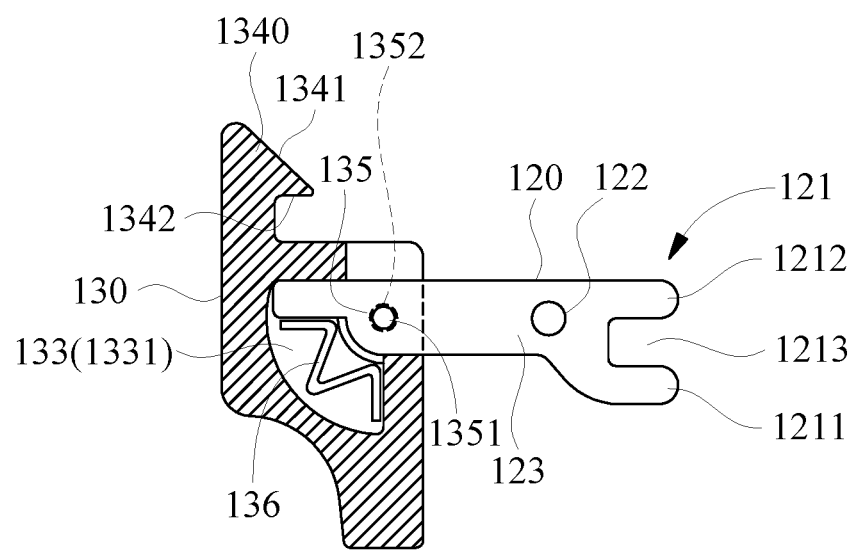
FIG. 25 is a partially sectioned front view of a first variation of the fourth preferred embodiment of the present invention, showing an elastic plate and a retaining section are included in the pull-out aiding device.
Figure 26A:
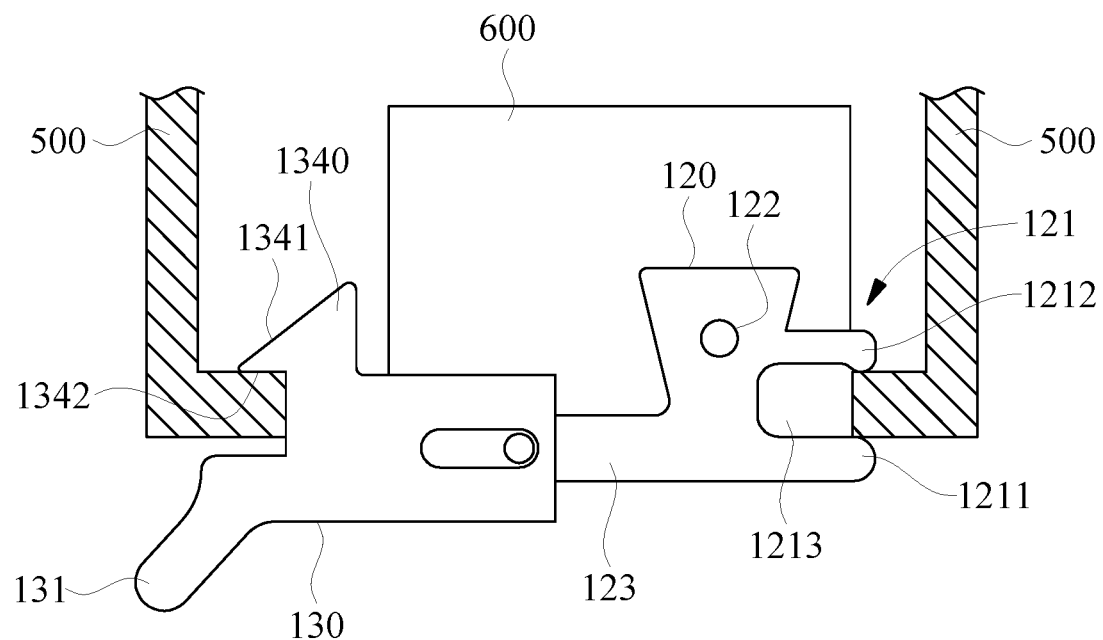
FIG. 26A shows how the pull-out aiding device according to the third preferred embodiment of the present invention is connected to and released from a first and a second object.
Figure 26B:
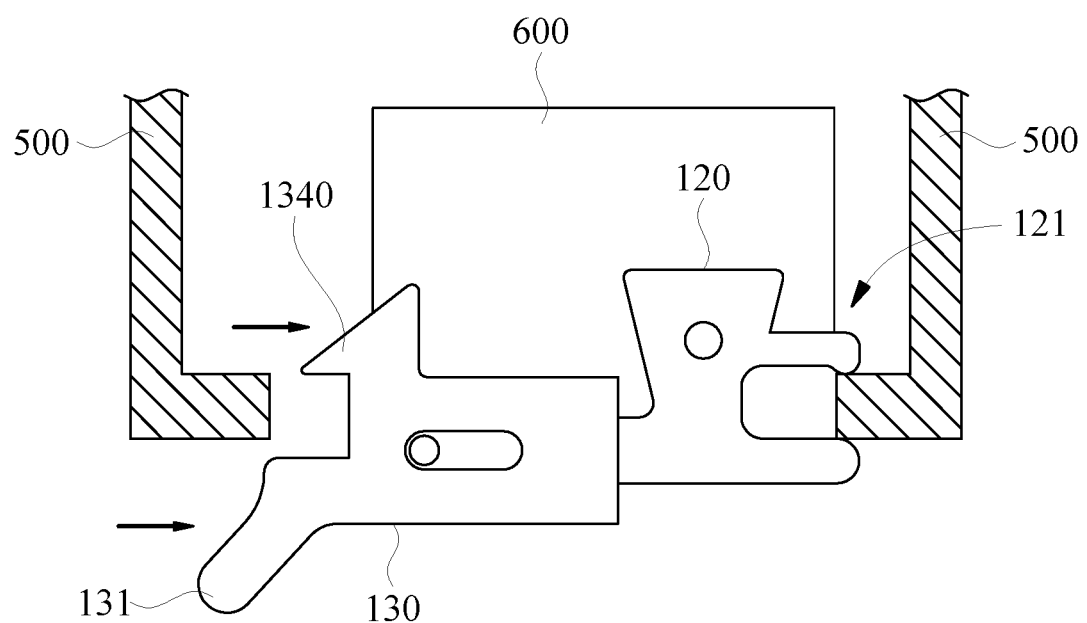
FIG. 26B shows how the pull-out aiding device according to the third preferred embodiment of the present invention is connected to and released from a first and a second object.

Please refer to FIGS. 14 to 22, in which a pull-out aiding device 100 according to a third preferred embodiment of the present invention and three variations thereof are shown, and to FIGS. 23 to 25, in which a pull-out aiding device 100 according to a fourth preferred embodiment of the present invention and a variation thereof are shown. As shown, in both of the third and fourth preferred embodiments, the pull-out aiding device 100 of the present invention includes a releasable fastening element 130 and a handle member 120 movably assembled to the releasable fastening element 130. The releasable fastening element 130 includes at least one latch 131, a receiving space 133 and a retaining section 1340 for detachably engaging with a first object 500 (see FIGS. 26A-D and 27A-D). The handle member 120 includes an operating section 123 and a second pivot section 122 provided on the operating section 123. The operating section 123 has an inner end movably associated with the receiving space 133 of the releasable fastening element 130; and the second pivot section 122 is located outside the receiving space 133 for detachably connecting with a second object 600 (see FIGS. 26A-D and 27A-D). The latch 131 can be a protrusion outward projected from any side of the releasable fastening element 130. As shown in FIG. 26B, by applying a force against the latch 131, the releasable fastening element 130 can be moved to release the retaining section 1340 from the first object 500, allowing the second object 600 to separate from the first object 500. The pull-out aiding device 100 according to the third and the fourth preferred embodiment of the present invention further include pin connection means 135 and an elastic element 136. The pin connection means 135 enables connection of the operating section 123 of the handle member 120 to the receiving space 133 of the releasable fastening element 130, such that the releasable fastening element 130 and the handle member 120 in the third and the fourth preferred embodiment are slidable and rotatable, respectively, relative to each other within a limited range and angle, respectively. The elastic element 136 is disposed in the receiving space 133 of the releasable fastening element 130, or can be disposed at a selected position, with an end pressed against an inner wall surface of the receiving space 133 and another opposite end against the operating section 123 of the handle member 120. The elastic element 136 enables and controls limited sliding or rotation of the releasable fastening element 130 and the handle member 120 relative to each other, and can elastically push the releasable fastening element 130 and the handle member 120 back to their original positions.

Figure 18:
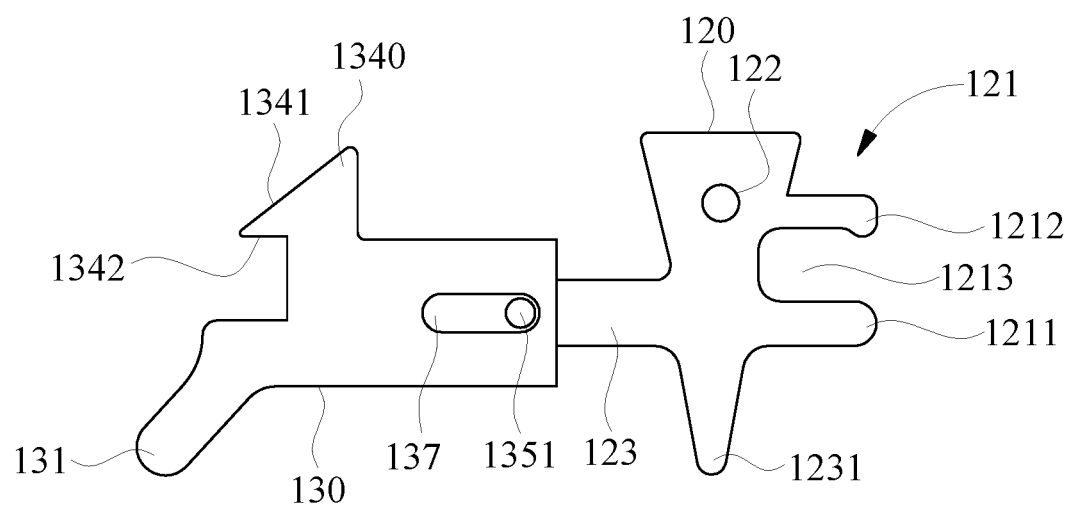
FIG. 18 is an assembled front view of a first variation of the pull-out aiding device according to the third preferred embodiment of the present invention, showing it further includes a hand push section.
Figure 19:
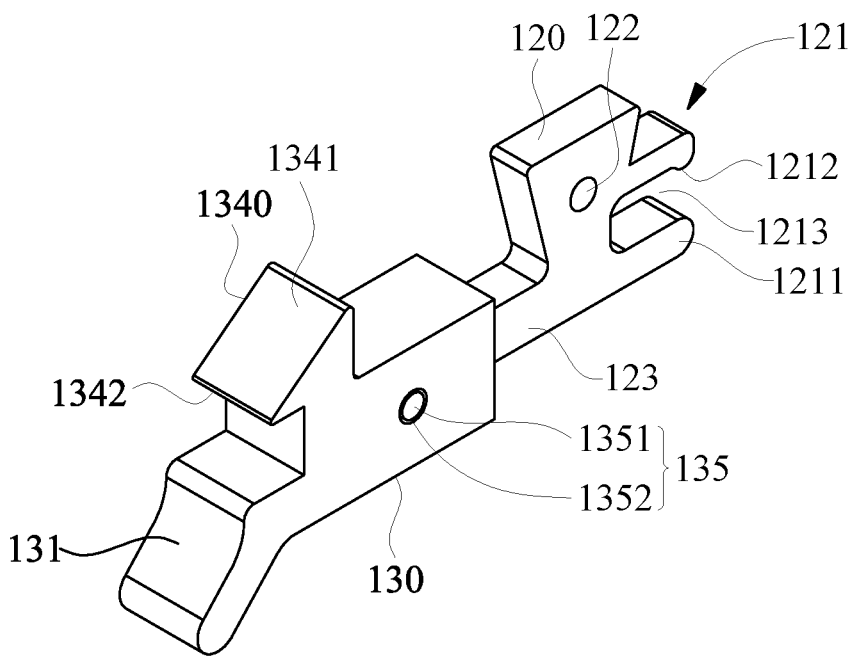
FIG. 19 is an assembled perspective view of a second variation of the third preferred embodiment of the present invention.

Please refer to FIG. 18 that is an assembled front view showing a first variant of the third preferred embodiment of the present invention. As shown, in the first variation of the third preferred embodiment, the handle member 120 further includes a hand push section 1231 provided on the operating section 123. The hand push section 1231 can be a protrusion downward projected from a lower side of the operating section 123 of the handle member 120. The hand push section 1231 and the latch 131 are directed to the same direction. In FIG. 18, the hand push section 1231 and the latch 131 are illustrated as directing downward. With this arrangement, a user may conveniently move the releasable fastening element 130 toward the handle member 120 by pressing one finger, such as the thumb, against an axially outer side (i.e. the left side in the drawing) of the latch 131 while pressing another finger, such as the index finger, against an axially outer side (i.e. the right side in the drawing) of the hand push section 1231.

Please refer to FIGS. 14 to 18. According to the third preferred embodiment and the first variation thereof, the releasable fastening element 130 and the handle member 120 are held to each other via the pin connection means 135 to allow limited sliding of them relative to each other, and accordingly, the retaining section 1340 is slidably engaged with or released from the first object 500. More specifically, the releasable fastening element 130 is provided with a pin connection slot 137, which communicates with the receiving space 133, and the pin connection means 135 is located in the pin connection slot 137. The pin connection slot 137 can be a long slide slot 1371 formed on one or two lateral walls of the receiving space 133. When the pin connection means 135 slides in the long slide slot 1371, the releasable fastening element 130 and the handle member 120 are brought to slide relative to each other within a limited range. Please refer to FIGS. 19 to 22 that show a second and a third variation of the pull-out aiding device 100 according to the third preferred embodiment of the present invention. In the second variation of the third preferred embodiment, the operating section 123 of the handle member 120 is formed with a long slide hole 1232, which is communicable with the receiving space 133, and the pin connection means 135 is slidable in the long slide hole 1232 to thereby bring the releasable fastening element 130 and the handle member 120 to slide relative to each other within a limited range.

Please refer to FIGS. 23 to 25, in which the pull-out aiding device 100 according to the fourth preferred embodiment of the present invention and a variation thereof are shown. As shown, in the fourth preferred embodiment and the variation thereof, the releasable fastening element 130 and the handle member 120 are held to each other via the pin connection means 135 to allow limited rotating of them relative to each other, and accordingly, the retaining section 1340 is rotatably engaged with or released from the first object 500. More specifically, the releasable fastening element 130 is also internally provided with a pin connection slot 137, which communicates with the receiving space 133, and the pin connection means 135 is located in the pin connection slot 137. According to an operable embodiment, the pin connection slot 137 can be a locating hole 1372 formed on one or two lateral walls of the receiving space 133. When the pin connection means 135 rotates in the locating hole 1372, the releasable fastening element 130 and the handle member 120 are brought to rotate relative to each other within a limited angle.

Figure 14:
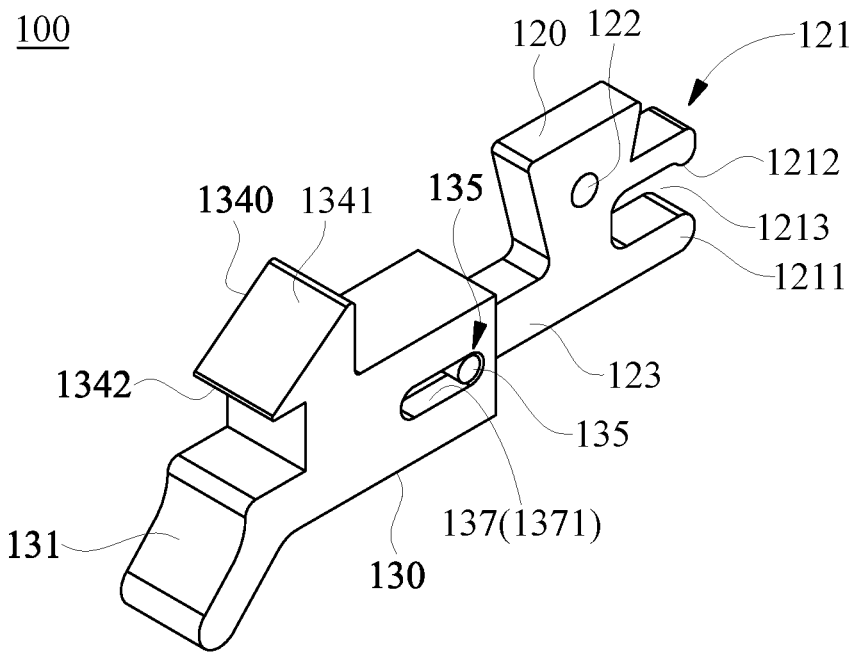
FIG. 14 is an assembled perspective view showing a pull-out aiding device according to a third preferred embodiment of the present invention.
Figure 15:
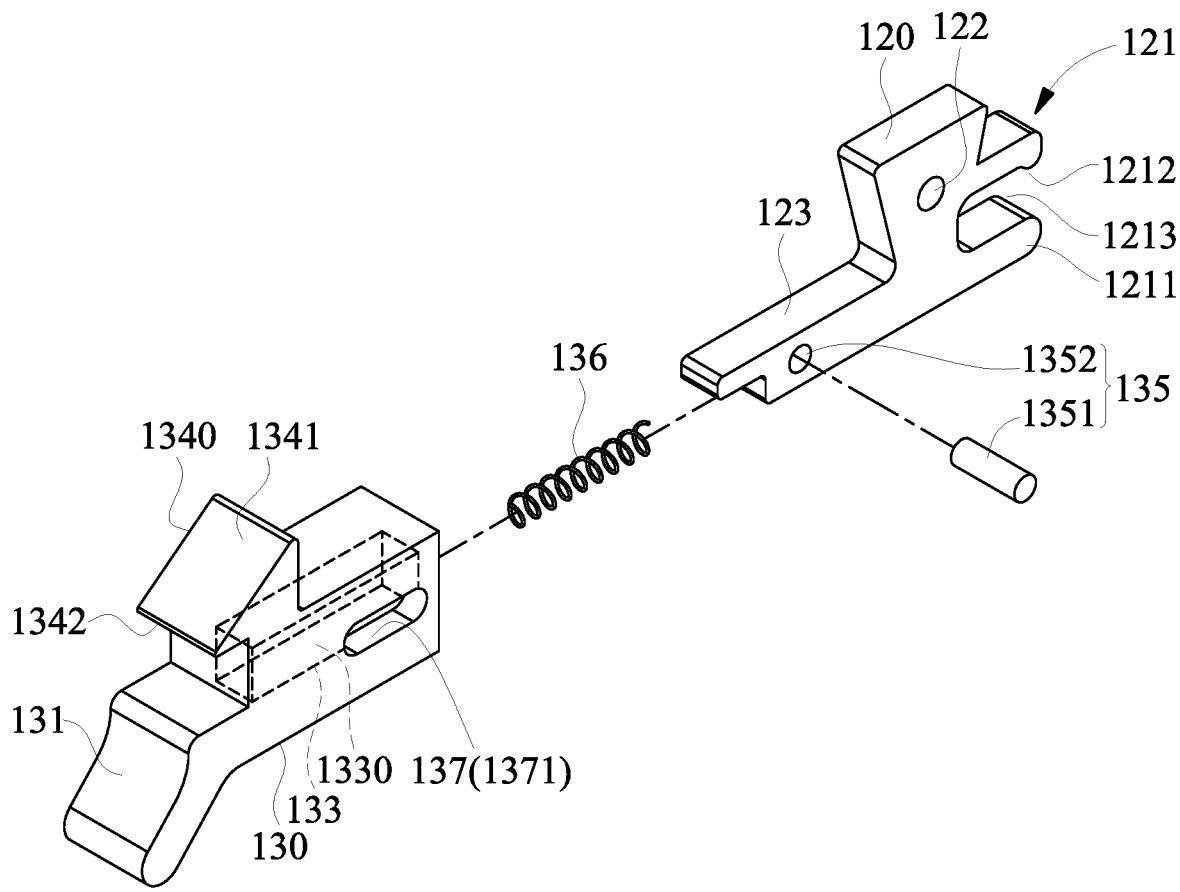
FIG. 15 is an exploded view of FIG. 14.
Figure 16:
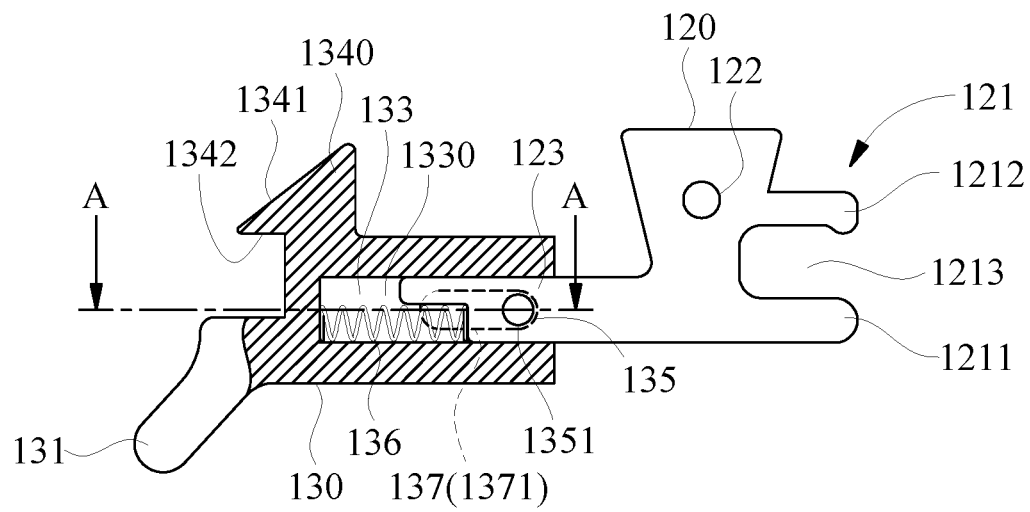
FIG. 16 is a partially sectioned front view of FIG. 14.
Figure 17:
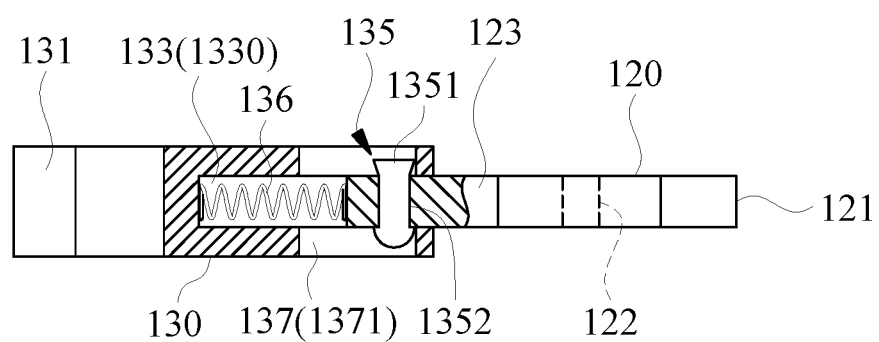
FIG. 17 is a sectional view taken along line A-A of FIG. 16.
Figure 20:
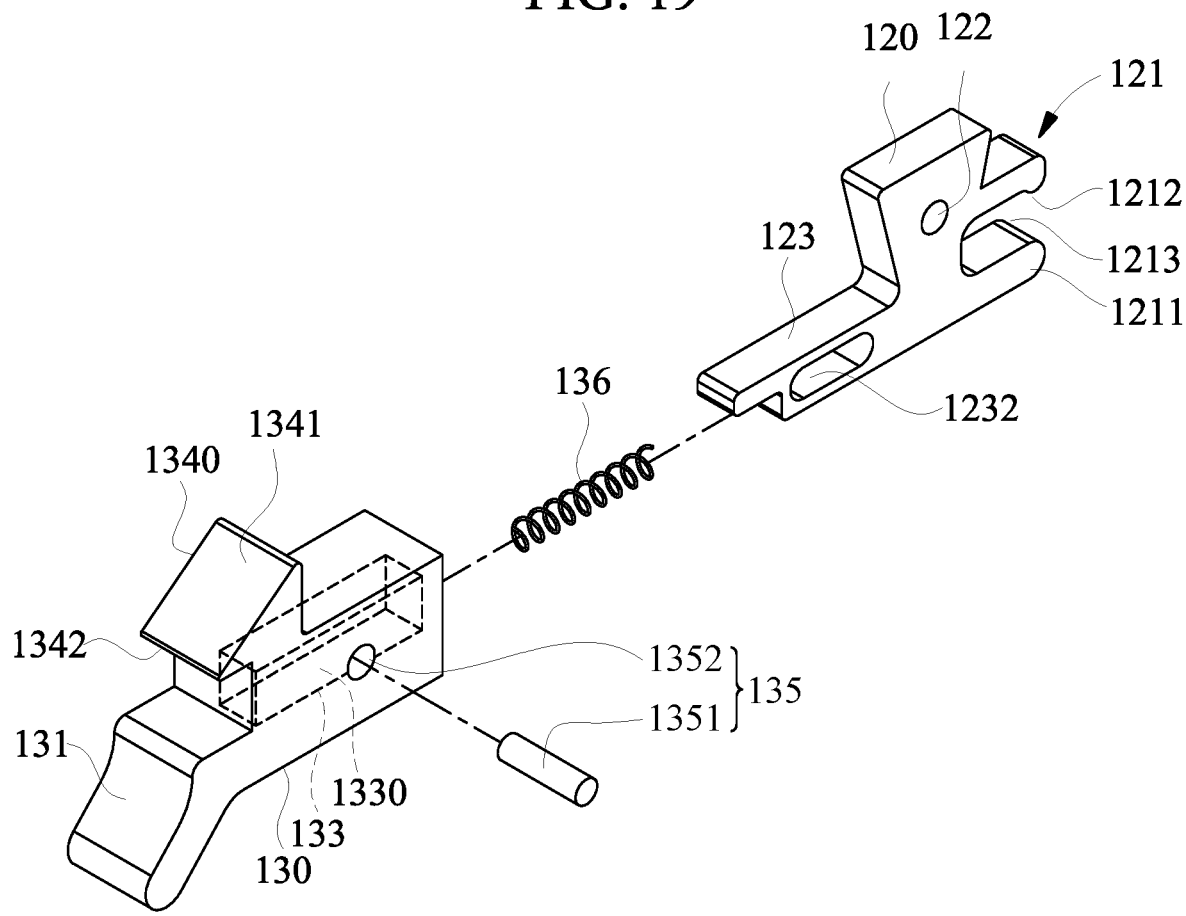
FIG. 20 is an exploded view of FIG. 19.
Figure 21:
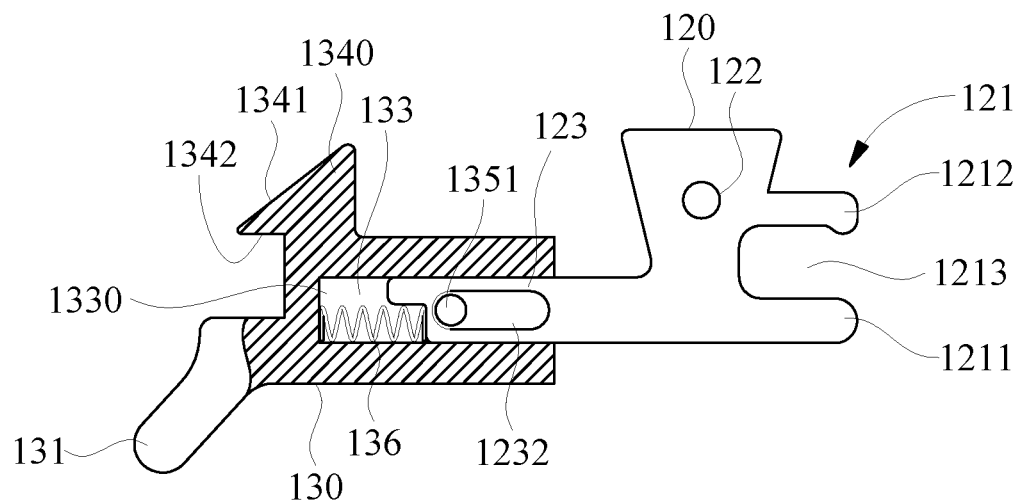
FIG. 21 is a partially sectioned front view of FIG. 19.
Figure 22:
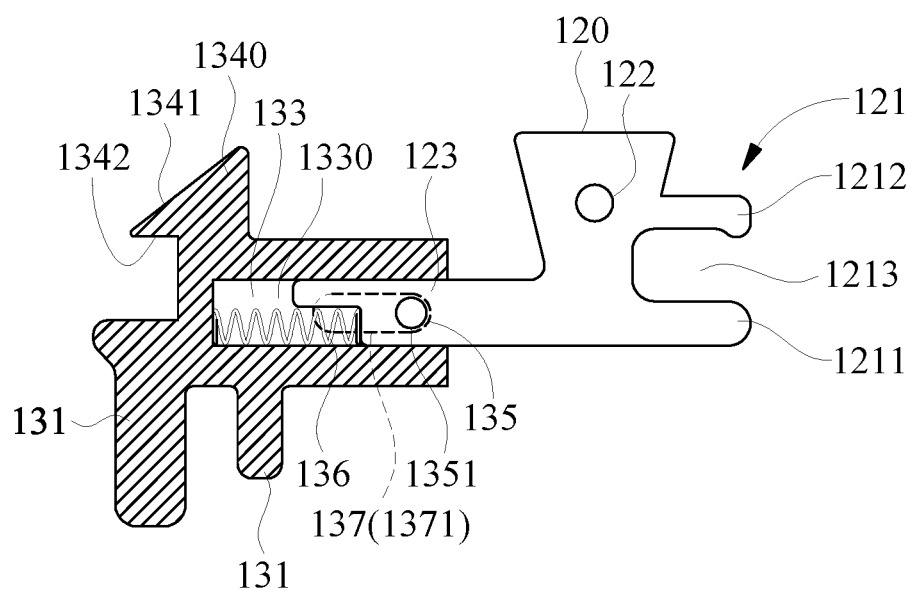
FIG. 22 is a partially sectioned front view of a third variation of the third preferred embodiment of the present invention, showing the operation of a latch and a pressing section included in the pull-out aiding device.

Please refer to FIGS. 14 and 15 as well as FIGS. 23 and 25. According to the present invention, the pin connection means 135 can include a cylindrical pin 1351 integrally formed with or additionally assembled to the operating section 123 of the handle member 120, and a pin holding hole 1352 formed on the operating section 123 of the handle member 120. The cylindrical pin 1351 is inserted in, snapped fitted in, riveted to, expansion-fitted in, glued to or screwed into the pin holding hole 1352. Alternatively, according to the present invention, the pin connection means 135 can include a cylindrical pin 1351 integrally formed with or additionally assembled to the releasable fastening element 130, and a pin holding hole 1352 formed on the operating section 123 of the handle member 120. Similarly, the cylindrical pin 1351 is inserted in, snapped fitted in, riveted to, expansion-fitted in, glued to or screwed into the pin holding hole 1352. By transversely and slidably setting the cylindrical pin 1351 of the pin connection means 135 in the long slide slot 1371 as in the third preferred embodiment, or by transversely and rotatably setting the cylindrical pin 1351 of the pin connection means 135 in the locating hole 1372 as in the fourth preferred embodiment, it is able to achieve the limited sliding or the limited rotation, respectively, of the releasable fastening element 130 and the handle member 120 relative to each other. Alternatively, as shown in FIG. 20, in the second variation of the third preferred embodiment, the pin connection means 135 includes a cylindrical pin 1351 integrally formed with or additionally assembled to the releasable fastening element 130 to transversely extend through the receiving space 133, and at least one pin holding hole 1352 preferably formed on the releasable fastening element 130 to communicate with the receiving space 133. Again, the cylindrical pin 1351 is inserted in, snapped fitted in, riveted to, expansion-fitted in, glued to or screwed into the pin holding hole 1352.

Please refer to FIGS. 14 to 25. In both of the third and the fourth preferred embodiment and the variations thereof, the retaining section 1340 on the releasable fastening element 130 can be a hook directed leftward (see FIGS. 14-24) or rightward (see FIG. 25) when viewing in front of the drawings. The hook is preferably a triangular or wedge shaped hook protruded from the releasable fastening element 130, and it includes a beveled guide surface 1341 and a hooking surface 1342 connected to a lower edge of the beveled guide surface 1341. As can be seen in FIG. 26A, the beveled guide surface 1341 allows the releasable fastening element 130 to be conveniently pressed into the first object 500, and the hooking surface 1342 can firmly abut on an inner side of the first object 500 after the beveled guide surface 1341 has been moved into the first object 500.

Figure 26C:
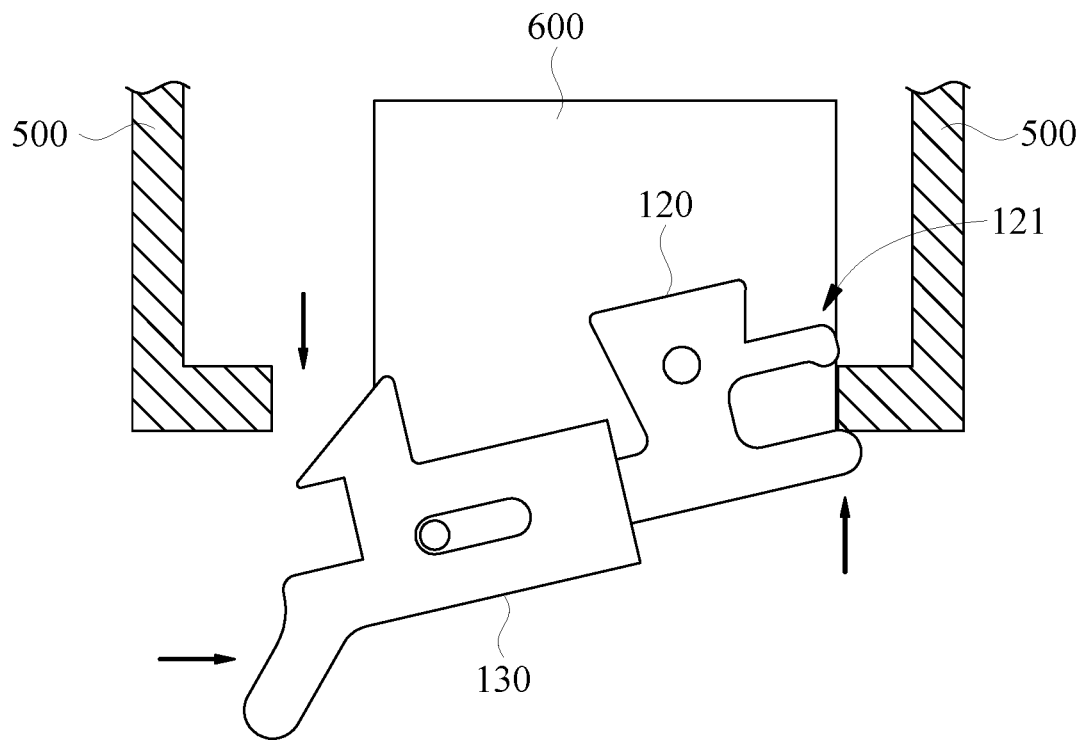
FIG. 26C shows how the pull-out aiding device according to the third preferred embodiment of the present invention is connected to and released from a first and a second object.

Please refer to FIGS. 14 to 22. In the third preferred embodiment and the variations thereof, the handle member 120 preferably includes at least one pressing section 121. As illustrated in the drawings, the pressing section 121 can be lying U-shaped to include a first jaw 1211 and a second jaw 1212 formed on an outer end thereof and a holding cavity 1213 defined between the first and the second jaw 1211, 1212. Referring to FIG. 26A, the first and second jaws 1211, 1212 and the holding cavity 1213 of the pressing section 121 can be used to hold the first object 500 thereto. When it is desired to release the second object 600 from the first object 500, simply turn the pull-out aiding device 100 as a lever to push the first object 500 out of the pressing section 121, and the second object 600 can be easily released from the first object 500, as shown in FIG. 26C.

In the third preferred embodiment and the variations thereof shown in FIGS. 14 to 22, the second pivot section 122 of the handle member 120 is preferably a protruded block, a retaining block or a through hole integrally formed with or additionally assembled to the operating section 123. As shown in FIG. 26A, the pull-out aiding device 100 of the present invention can be movably connected to the second object 600 via the protruded block, the retaining block or the through hole. Preferably, the second pivot section 122 can be inserted in, snapped fitted onto, riveted to, expansion-fitted onto or screwed to the second object 600, so that the pull-out aiding device 100 and the second object 600 are rotatably connected to each other.

In the third preferred embodiment and the variations thereof shown in FIGS. 14 to 22, the receiving space 133 in the releasable fastening element 130 includes a straight and rectangular-sectioned slide space 1330. The inner end of the operating section 123 of the handle member 120 is extended into the slide space 1330 and is slidably held therein via the pin connection means 135, so that the releasable fastening element 130 and the handle member 120 are able to slide relative to each other within a limited range. The elastic element 136 is preferably a coil spring, as shown in FIGS. 14 to 22, but it can also be an elastic plate or an elastic bar. The elastic element 136 is disposed in the slide space 1330 with an end pressed against an inner wall surface of the slide space 1330 and another end pressed against the operating section 123, such that the releasable fastening element 130 and the handle member 120 can slide relative to each other within a limited range and then return to their respective original position under the elastic force of the elastic element 136.

In the fourth preferred embodiment and the variation thereof shown in FIGS. 23 to 25, the receiving space 133 in the releasable fastening element 130 includes an arcuate slide space 1331. The inner end of the operating section 123 of the handle member 120 is extended into the arcuate slide space 1331 and is rotatably held therein via the pin connection means 135, so that the releasable fastening element 130 and the handle member 120 are able to rotate relative to each other within a limited angle. Again, the elastic element 136 is preferably a coil spring, as shown in FIG. 23, but it can also be an elastic plate as shown in FIG. 25 or an elastic bar (not shown). The elastic element 136 is disposed in the arcuate slide space 1331 with an end pressed against an inner wall surface of the slide space 1331 and another end pressed against the operating section 123, such that the releasable fastening element 130 and the handle member 120 can rotate relative to each other within a limited angle and then return to their respective original position under the elastic force of the elastic element 136.

Figure 26D:
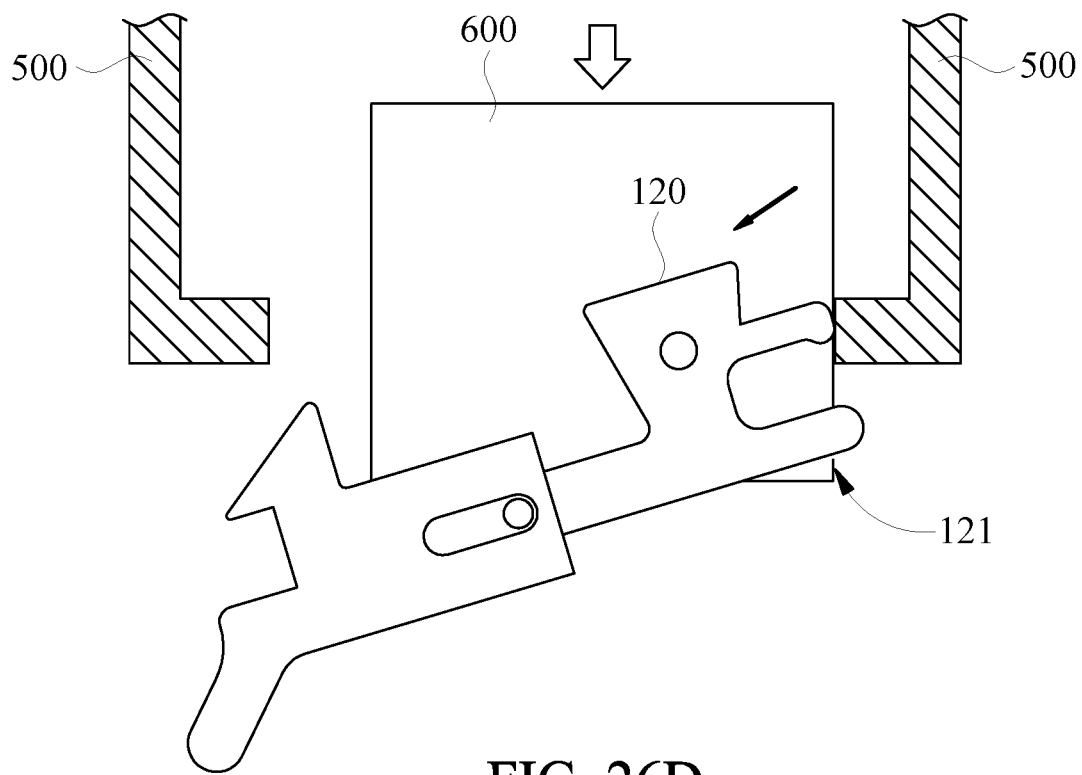
FIG. 26D shows how the pull-out aiding device according to the third preferred embodiment of the present invention is connected to and released from a first and a second object.

According to the present invention, the first object 500 can be a rack, a chassis, a cabinet for drawers, a window frame or other objects; and the second object 600 can be a circuit board card, a drawer, a window or other objects. FIG. 26A shows the pull-out aiding device 100 according to the third preferred embodiment of the present invention is movably assembled to the second object 600 via the second pivot section 122 of the handle member 120. Meanwhile, the retaining section 1340 of the releasable fastening element 130 and the pressing section 121 of the handle member 120 are detachably engaged with two opposite sides of the first object 500, so that the second object 600 is located in and sidewardly slidably connected to the first object 500 via the pull-out aiding device 100. When it is desired to separate the second object 600 from the first object 500, simply push the latch 131 of the releasable fastening element 130 with one hand, as indicated by FIG. 26B, so that the releasable fastening element 130 slides toward the handle member 120 by a limited range to separate the retaining section 1340 from one side of the first object 500. Then, as shown in FIG. 26C, utilize the principle of leverage to push the pull-out aiding device 100 for the handle member 120 to rotate about the second pivot section 122, bringing the pressing section 121 to push the other side of the first object 500 away from it. At this point, the second object 600 can be pulled to slide out of the first object 500. Finally, as shown in FIG. 26D, when the second object 600 is separated from the first object 500 and the latch 131 is no longer subjected to a push, the elastic element 136 automatically pushes the releasable fastening element 130 to slide relative to the handle member 2 back to its original position.

Figure 27A:
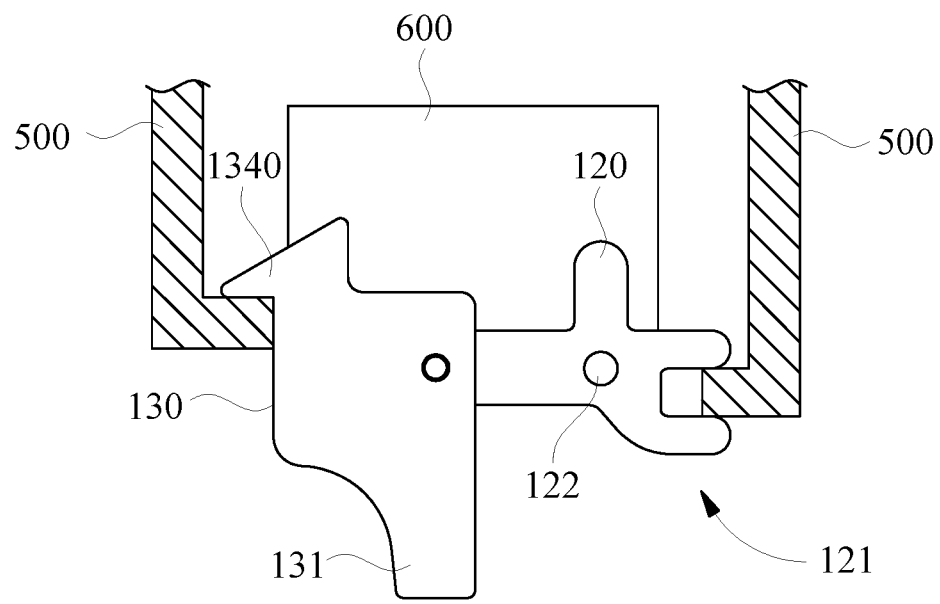
FIG. 27A shows how the pull-out aiding device according to the fourth preferred embodiment of the present invention is connected to and released from a first and a second object.
Figure 27B:
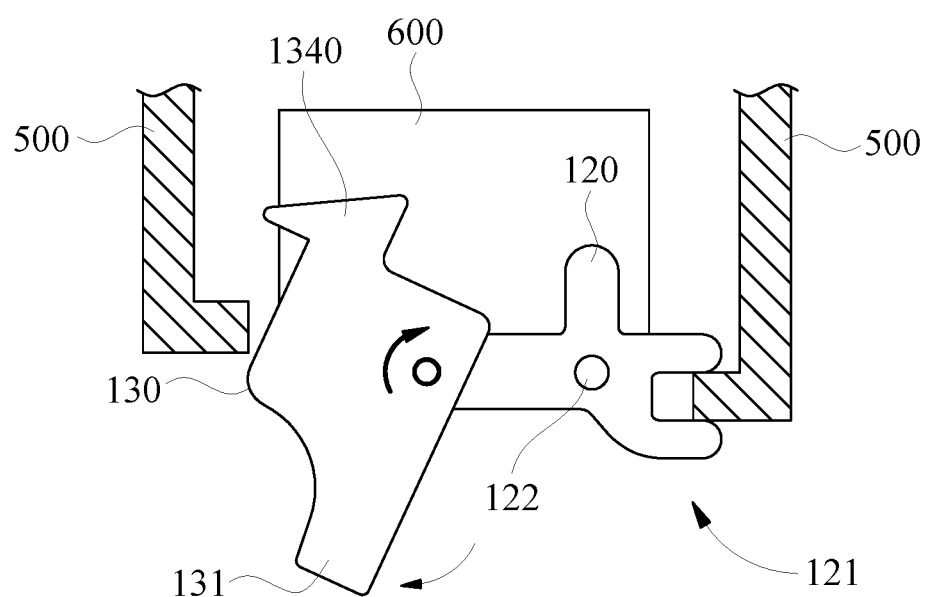
FIG. 27B shows how the pull-out aiding device according to the fourth preferred embodiment of the present invention is connected to and released from a first and a second object.
Figure 27C:
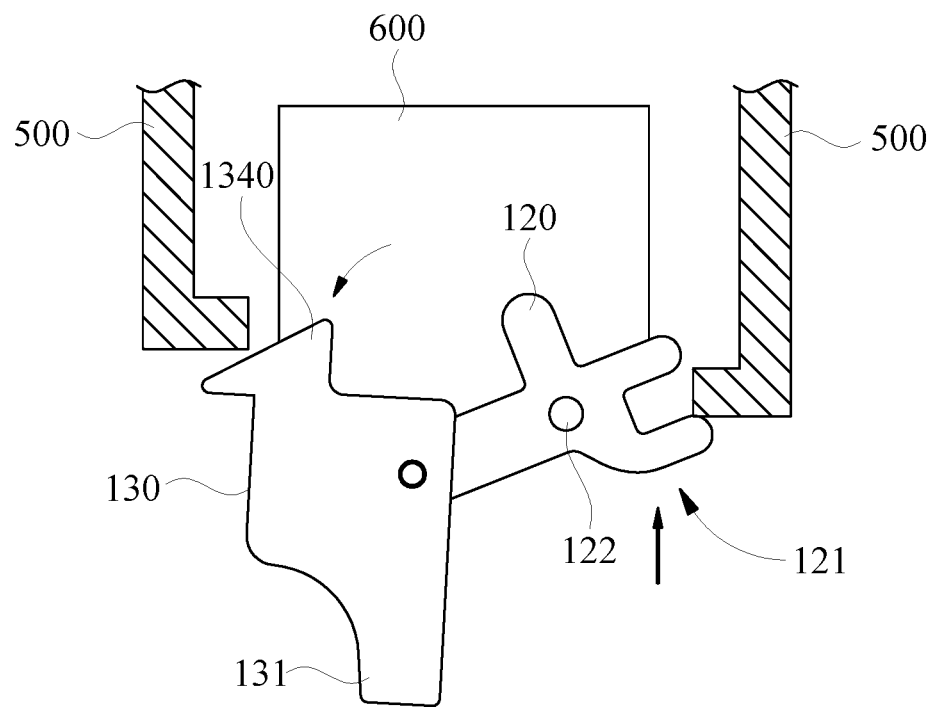
FIG. 27C shows how the pull-out aiding device according to the fourth preferred embodiment of the present invention is connected to and released from a first and a second object.
Figure 27D:
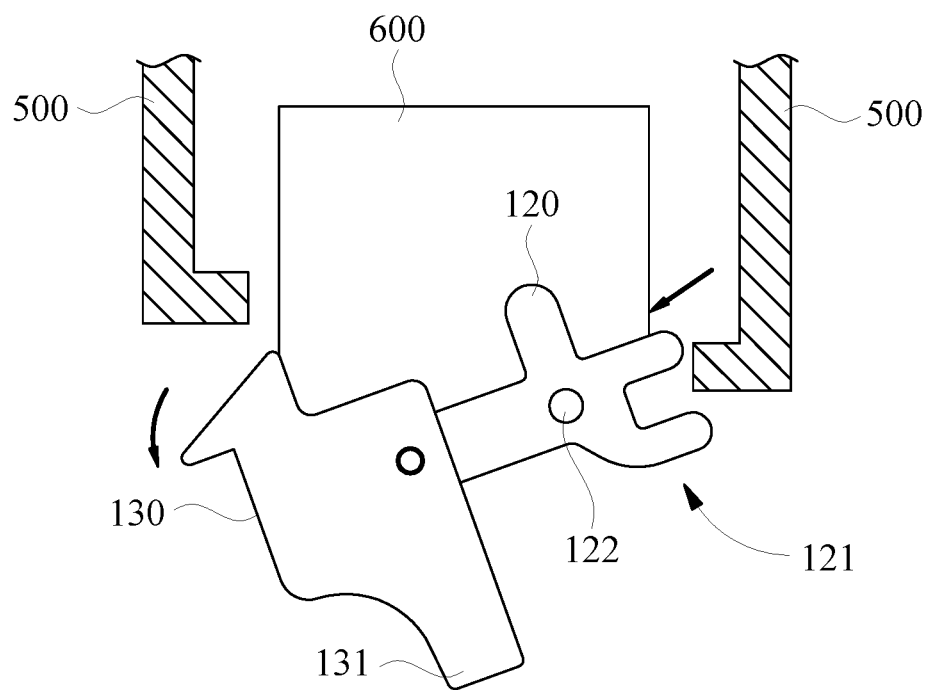
FIG. 27D shows how the pull-out aiding device according to the fourth preferred embodiment of the present invention is connected to and released from a first and a second object.

FIG. 27A shows the pull-out aiding device 100 according to the fourth preferred embodiment of the present invention is similarly movably assembled to the second object 600 via the second pivot section 122 of the handle member 120. Meanwhile, the retaining section 1340 of the releasable fastening element 130 and the pressing section 121 of the handle member 120 are detachably engaged with two opposite sides of the first object 500, so that the second object 600 is located in and sidewardly movably connected to the first object 500 via the pull-out aiding device 100. When it is desired to separate the second object 600 from the first object 500, simply push the latch 131 of the releasable fastening element 130 with one hand, as indicated by FIG. 27B, so that the releasable fastening element 130 rotates relative to the handle member 120 by a limited angle to separate the retaining section 1340 from one side of the first object 500. Then, as shown in FIG. 27C, utilize the principle of leverage to push the pull-out aiding device 100 for the handle member 120 to rotate about the second pivot section 122, bringing the pressing section 121 to push the other side of the first object 500 away from it. At this point, the second object 600 can be pulled to slide out of the first object 500. Finally, as shown in FIG. 27D, when the second object 600 is separated from the first object 500 and the latch 131 is no longer subjected to a push, the elastic element 136 automatically pushes the releasable fastening element 130 to rotate relative to the handle member 120 back to its original position.

Figure 28:
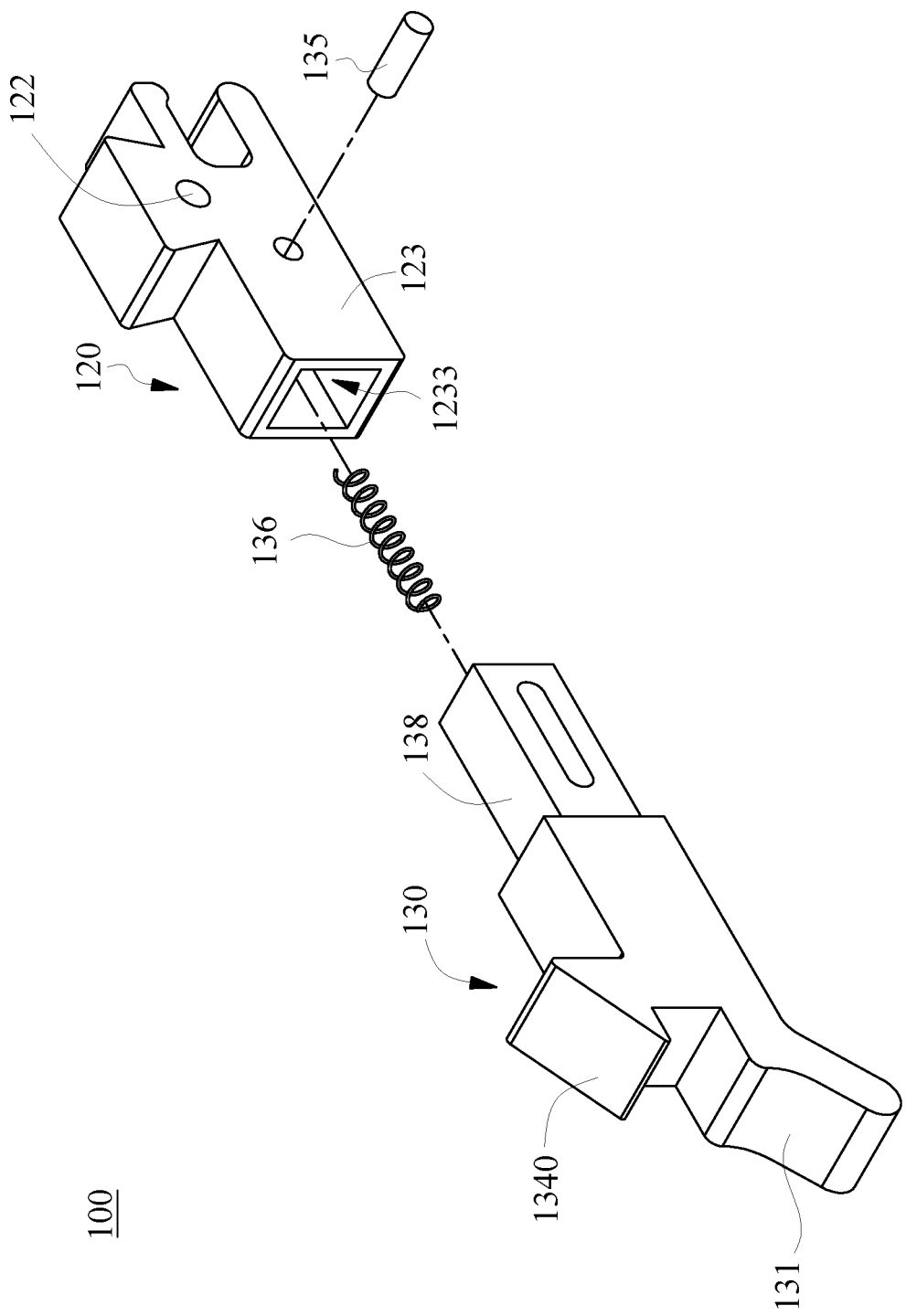
FIG. 28 is an exploded perspective view of a pull-out aiding device according to a fifth preferred of the present invention.

Please refer to FIG. 28, which is an exploded perspective view of a pull-out aiding device 100 according to a fifth preferred embodiment of the present invention. As shown, in the fifth preferred embodiment, the releasable fastening element 130 of the pull-out aiding device 100 includes a body portion 138, and the operating section 123 of the handle member 120 includes a receiving space 1233. The body portion 138 of the releasable fastening element 130 is associated with the receiving space 1233 of the handle member 120 via pin connection means 135. The pin connection means 135 enables connection of the handle member 120 to the releasable fastening element 130, such that the releasable fastening element 130 and the handle member 120 are movable relative to each other within a limited range. The elastic element 136 is disposed in the receiving space 1233 with an end pressed against an inner wall surface of the receiving space 1233 and another opposite end against the body portion 138. In this manner, the elastic element 136 enables and controls the limited movement of the releasable fastening element 130 and the handle member 120 relative to each other, and can elastically push the releasable fastening element 130 and the handle member 120 back to their original positions.

Figure 29:
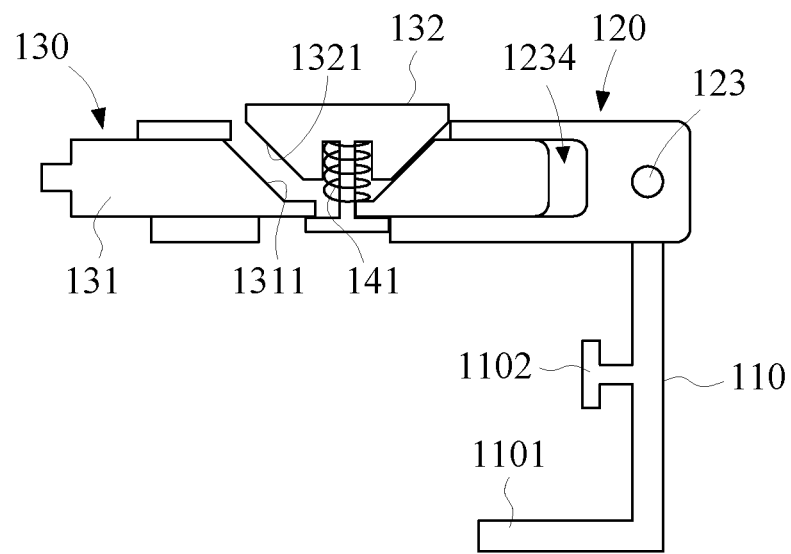
FIG. 29 is a partially sectioned front view of a pull-out aiding device according to a sixth preferred embodiment of the present invention.

Please refer to FIG. 29 that is a partially sectioned front view of a pull-out aiding device 100 according to a sixth preferred embodiment of the present invention. As shown, in the sixth preferred embodiment, the operating section 123 of the handle member 120 is provided with a receiving chamber 1234, and the releasable fastening element 130 is movably associated with the receiving chamber 1234; and the latch 131 of the releasable fastening element 130 has a hand shifting member 132 movably assembled thereto. In the sixth preferred embodiment, the latch 131 has a movement-driven surface 1311, along and against which a movement-driving surface 1321 of the hand shifting member 132 is moved to drive the latch 131 to displace in the receiving chamber 1234. An elastic element 141 is disposed between the latch 131 and the hand shifting member 132 with two ends of the elastic element 141 separately pressed against the latch 131 and the hand shifting member 132. In the sixth preferred embodiment, the pull-out aiding device 100 also includes a pulling member 110 that is provided with a lifting and pulling section 1101 and a securing section 1102. The lifting and pulling section 1101 is used to lift and pull a corresponding apparatus (not shown), and the securing section 1102 is used to secure to the corresponding apparatus.

To use the pull-out aiding device 100 according to the sixth preferred embodiment of the present invention, first push the hand shifting member 132 so that the movement-driving surface 1321 of the hand shifting member 132 is pressed against the movement-driven surface 1311 of the latch 131 and the elastic element 141 is compressed. When the movement-driving surface 1321 is pressed against the movement-driven surface 1311, the latch 131 is driven by the hand shifting member 132 to move toward the handle member 120, and an internal space of the receiving chamber 1234 is gradually reduced or increased with the movement of the latch 131 into or out of the receiving chamber 1234. When the latch 131 is partially moved into the receiving chamber 1234, the releasable fastening element 130 is displaced and the latch 131 is separated from the second partitioning wall (not shown in FIG. 29). On the other hand, when the hand shifting member 132 is no longer subjected to a push force applied thereto, the elastic restoring force of the elastic element 141 pushes the latch 131 and the hand shifting member 132 back to their original positions. At this point, the latch 131 will engage with the second partitioning wall.

Figure 30:
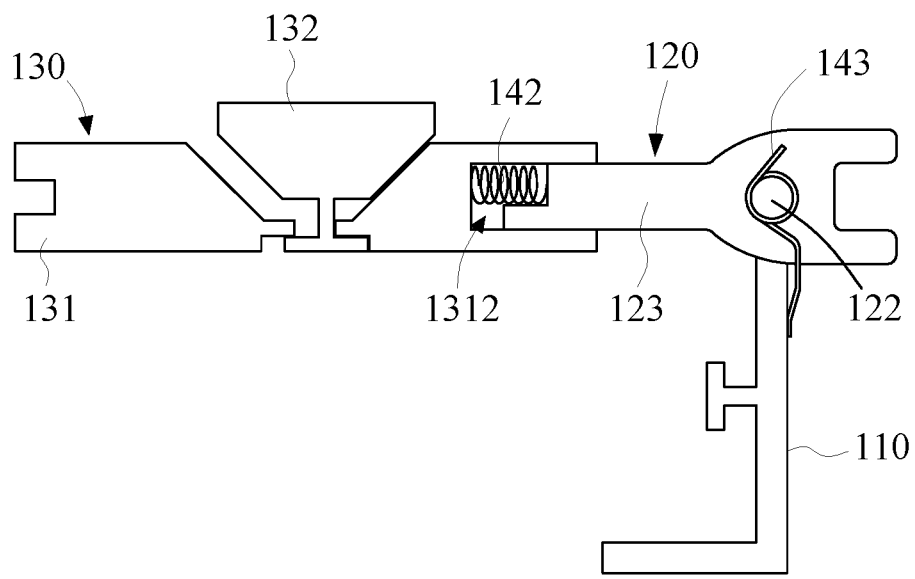
FIG. 30 is a partially sectioned front view of a pull-out aiding device according to a seventh preferred embodiment of the present invention.

FIG. 30 is a partially sectioned front view of a pull-out aiding device according to a seventh preferred embodiment of the present invention. As shown, in the seventh preferred embodiment, the latch 131 of the releasable fastening element 130 is provided with a receiving chamber 1312, and the operating section 123 of the handle member 120 is movably associated with the receiving chamber 1312. In the seventh preferred embodiment, the latch 131 has a hand shifting member 132 movably assembled thereto, a first elastic element 142 is disposed in the receiving chamber 1312 with two ends separately pressed against the latch 131 and the operating section 123, and a second elastic element 143 is disposed on the second pivot section 122 with two ends separately pressed against the pulling member 110 and the handle member 120.

To use the pull-out aiding device 100 according to the seventh preferred embodiment of the present invention, first push the hand shifting member 132 so that the latch 131 is driven by the hand shifting member 132 to move toward the handle member 120 and the first elastic element 142 is compressed. At this point, the operating section 123 is partially moved into the receiving chamber 1312 and the latch 131 is separated from the second partitioning wall (not shown in FIG. 30). On the other hand, when the hand shifting member 132 is no longer subjected to a push force applied thereto, the elastic restoring force of the first elastic element 142 pushes the latch 131 and the hand shifting member 132 back to their original positions. At this point, the latch 131 will engage with the second partitioning wall and the handle member 120 that has been moved can also be automatically returned its original position by the second elastic element 143.

Figure 31:
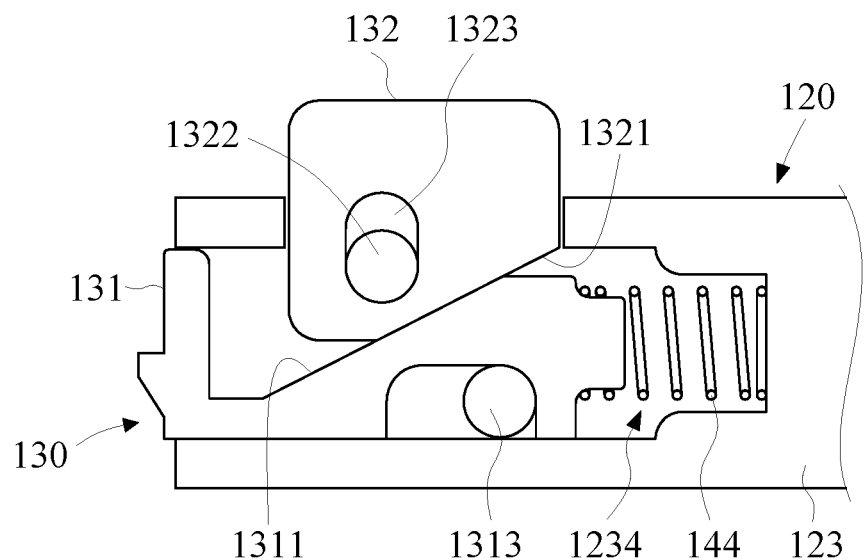
FIG. 31 is a fragmentary, partially sectioned front view showing the operation of a pull-out aiding device according to an eighth preferred embodiment of the present invention.
Figure 32:
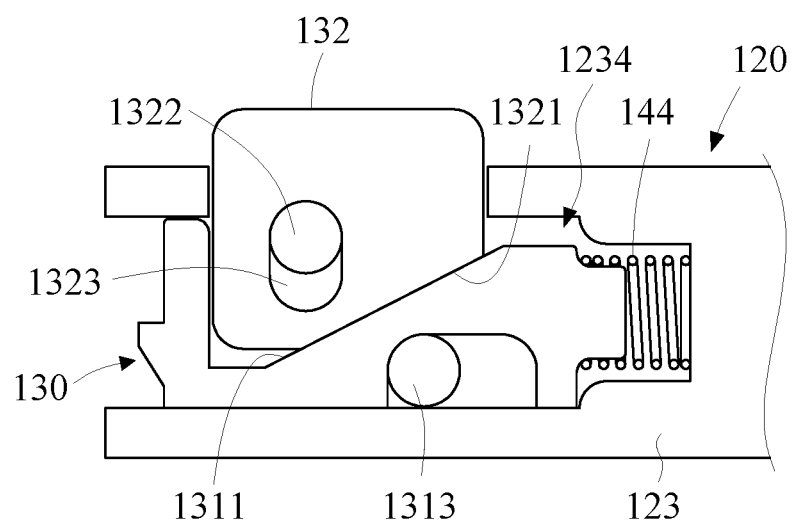
FIG. 32 is a fragmentary, partially sectioned front view showing the operation of a pull-out aiding device according to an eighth preferred embodiment of the present invention.

Please refer to FIGS. 31 and 32, which are fragmentary, partially sectioned front views showing the operation of a pull-out aiding device 100 according to an eighth preferred embodiment of the present invention. In the eighth preferred embodiment, the hand shifting member 132 of the releasable fastening element 130 is provided with a stop portion 1322 and a movement opening 1323, within which the stop portion 1322 is movable; the latch 131 is coupled with the operating section 123 via at least one coupling member 1313; and an elastic element 144 is disposed in the receiving chamber 1234 with two ends separately pressed against the latch 131 and the operating section 123.

To operate the pull-out aiding device 100 according to the eighth preferred embodiment of the present invention, first downward push the hand shifting member 132. At this point, through the movable engagement of the movement opening 1323 with the stop portion 1322, the hand shifting member 132 is moved in the receiving chamber 1234 toward the handle member 120. Meanwhile, the movement-driving surface 1321 of the hand shifting member 132 is pressed against the movement-driven surface 1311 of the latch 131, bringing the latch 131 to move on the coupling member 1313 toward the handle member 120 to thereby compress the elastic element 144 to achieve the purpose of using the hand shifting member 132 to move the latch 131 in the receiving chamber 1234.

Figure 33:
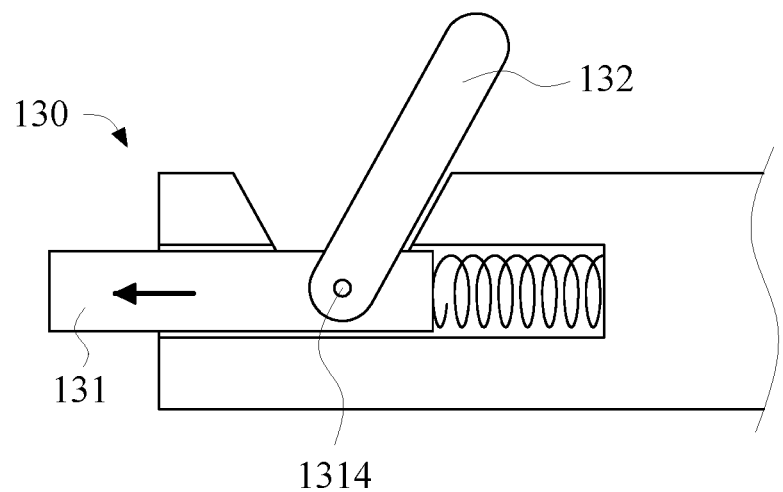
FIG. 33 is a fragmentary, partially sectioned front view showing the operation of a pull-out aiding device according to a ninth preferred embodiment of the present invention.
Figure 34:
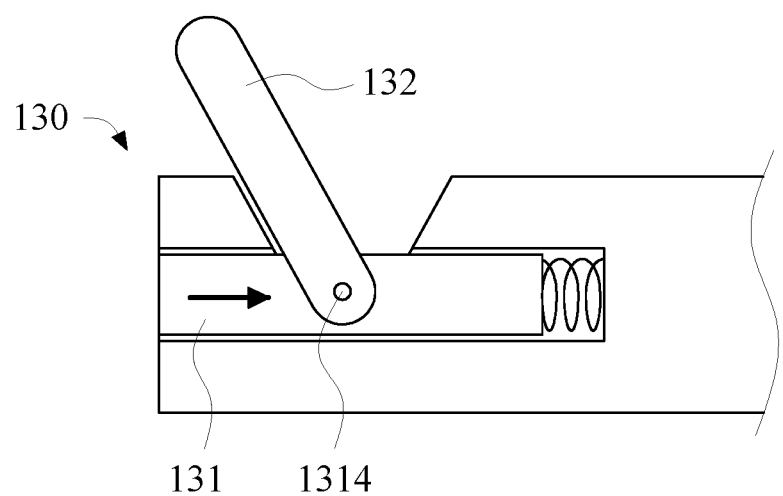
FIG. 34 is a fragmentary, partially sectioned front view showing the operation of a pull-out aiding device according to a ninth preferred embodiment of the present invention.

Please refer to FIGS. 33 and 34, which are fragmentary, partially sectioned front views showing the operation of a pull-out aiding device 100 according to a ninth preferred embodiment of the present invention. In the ninth preferred embodiment, the latch 131 of the releasable fastening element 130 is movably assembled to a hand shifting member 132 via pin connection means 1314. When the hand shifting member 132 is pivotally turned about the pin connection means 1314, the latch 131 is brought to engage with or release from the second partitioning wall (not shown in FIGS. 33 and 34).

Figure 35:
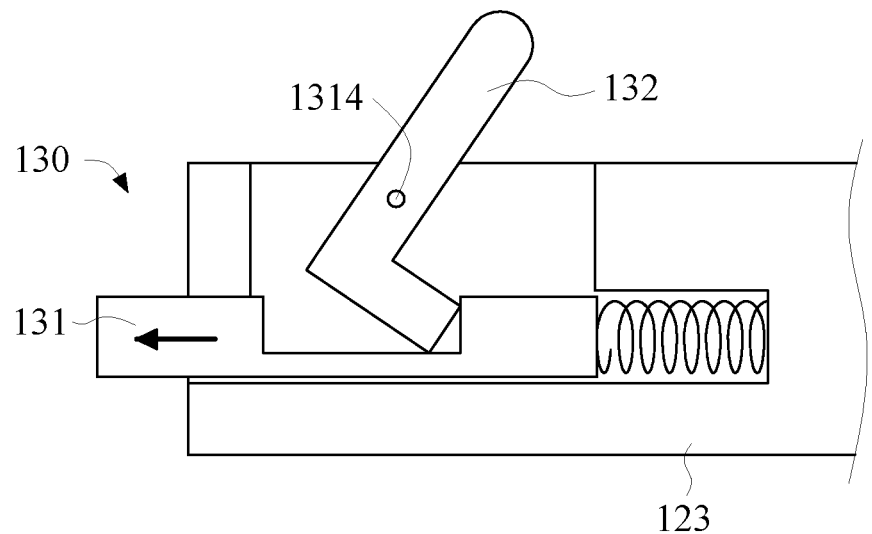
FIG. 35 is a fragmentary, partially sectioned front view showing the operation of a pull-out aiding device according to a tenth preferred embodiment of the present invention.
Figure 36:
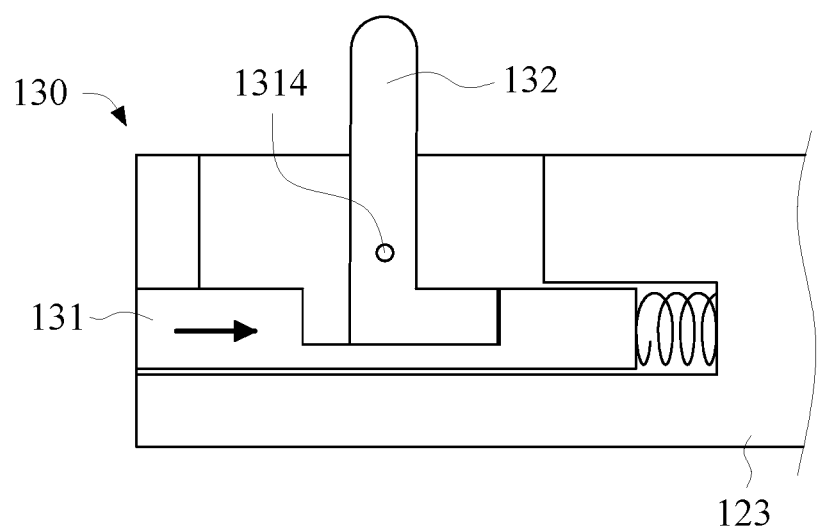
FIG. 36 is a fragmentary, partially sectioned front view showing the operation of a pull-out aiding device according to a tenth preferred embodiment of the present invention.

Please refer to FIGS. 35 and 36, which are fragmentary, partially sectioned front views showing the operation of a pull-out aiding device 100 according to a tenth preferred embodiment of the present invention. In the tenth preferred embodiment, the latch 131 of the releasable fastening element 130 movably interferes with a hand shifting member 132, which is movably assembled to the operating section 123 via pin connection means 1314. When the hand shifting member 132 is pivotally turned about the pin connection means 1314, the latch 131 is brought to engage with or release from the second partitioning wall (not shown in FIGS. 35 and 36).

The present invention has been described with some preferred embodiments thereof and it is understood that the preferred embodiments are only illustrative and not intended to limit the present invention in any way and many changes and modifications in the described embodiments can be carried out without departing from the scope and the spirit of the invention that is intended to be limited only by the appended claims.

What is claimed is:

1. A pull-out aiding device for mounting on an object, comprising:
a pulling member including a first pivot section and an abutting section;
a handle member including a second pivot section and an operating section; the second pivot section being pivotally connected to the first pivot section, such that the handle member is turnable about the second pivot section; and the operating section being provided with a receiving chamber; and
a releasable fastening element being movably associated with the receiving chamber of the operating section and including one or more latches;
wherein the one or more latches of the releasable fastening element has a hand shifting member movably assembled thereto; the one or more latches including a movement- driven surface and the hand shifting member including a first movement driving surface having a first angle, and a second movement driving surface having a second angle, the second angle being different from the first angle; and the hand shifting member being movable to vertically press the first movement-driving surface against the movement-driven surface of the one or more latches to thereby cause horizontal displacement of the one or more latches in the receiving chamber of the operating section.

2. The pull-out aiding device as claimed in claim 1, further comprising an elastic element; and the elastic element being selectively disposed between the one or more latches and the hand shifting member with two ends of the elastic element separately pressed against the one or more latches and the hand shifting member, or disposed between the one or more latches and the operating section with two ends of the elastic element separately pressed against the one or more latches and the operating section.

3. The pull-out aiding device as claimed in claim 1, wherein the latch of the releasable fastening element has a hand shifting member movably assembled thereto, the receiving chamber of the operating section has a first elastic element disposed therein with two ends of the first elastic element separately pressed against the latch and the operating section, and the second pivot section of the handle member has a second elastic element disposed thereon with two ends of the second elastic element separately pressed against the pulling member and the handle member.

4. The pull-out aiding device as claimed in claim 1, wherein the hand shifting member or the handle member is provided with a stop portion and a movement opening, within which the stop portion is movable.

5. The pull-out aiding device as claimed in claim 1, wherein the latch is coupled with the operating section via at least one coupling member or pin connection means; or wherein the releasable fastening element is coupled with the operating section via at least one couple member or pin connection means.

6. The pull-out aiding device as claimed in claim 1, wherein the latch of the releasable fastening element movably interferes with a hand shifting member and the hand shifting member is movably assembled to operating section via pin connection means; or wherein the latch of the releasable fastening element has a hand shifting member movably assembled thereto via pin connection means.

7. The pull-out aiding device as claimed in claim 1, wherein the abutting section is configured to pull a corresponding apparatus, and the abutting section being selected from the group consisting of an L-shaped member, a hook, a protrusion, a recessed member, a stepped structure, a flat member, a cambered member, a curved member, a latch, a box, a case and a coupling member.

\* \* \* \* \*